(12) United States Patent
Hioka

(10) Patent No.: US 12,211,561 B2
(45) Date of Patent: Jan. 28, 2025

(54) SEMICONDUCTOR STORAGE DEVICE ACQUIRING VOLTAGE FROM DUMMY PILLARS

(71) Applicant: KIOXIA CORPORATION, Tokyo (JP)

(72) Inventor: Takeshi Hioka, Machida Tokyo (JP)

(73) Assignee: Kioxia Corporation, Tokyo (JP)

( * ) Notice: Subject to any disclaimer, the term of this patent is extended or adjusted under 35 U.S.C. 154(b) by 241 days.

(21) Appl. No.: 17/899,951

(22) Filed: Aug. 31, 2022

(65) Prior Publication Data

US 2023/0290417 A1  Sep. 14, 2023

(30) Foreign Application Priority Data

Mar. 8, 2022 (JP) .................. 2022-034959

(51) Int. Cl.
*G11C 16/28* (2006.01)
*G11C 16/04* (2006.01)
*G11C 16/14* (2006.01)

(52) U.S. Cl.
CPC .......... *G11C 16/28* (2013.01); *G11C 16/0483* (2013.01); *G11C 16/14* (2013.01)

(58) Field of Classification Search
CPC ..... G11C 16/28; G11C 16/0483; G11C 16/14; G11C 2211/5621; G11C 11/5628; G11C 11/5635; G11C 11/5642; G11C 16/16; G11C 16/24; G11C 16/3459; G11C 16/32; G11C 16/08; G11C 16/10; G11C 16/26

See application file for complete search history.

(56) References Cited

U.S. PATENT DOCUMENTS

| 2006/0250848 A1 | 11/2006 | Maejima |
| 2012/0243314 A1* | 9/2012 | Maeda .................. H10B 43/10 365/185.05 |
| 2015/0270008 A1 | 9/2015 | Kim et al. |
| 2017/0330887 A1 | 11/2017 | Kim et al. |
| 2019/0035807 A1 | 1/2019 | Kim et al. |
| 2019/0341396 A1 | 11/2019 | You et al. |
| 2020/0075621 A1* | 3/2020 | Nakaki .................. H10B 43/35 |
| 2020/0160914 A1* | 5/2020 | Yang .................. G11C 11/5628 |

(Continued)

FOREIGN PATENT DOCUMENTS

| JP | 2006-302960 A | 11/2006 |
| TW | I750605 B | 12/2021 |

*Primary Examiner* — Jerome Leboeuf

(74) *Attorney, Agent, or Firm* — Kim & Stewart LLP

(57) ABSTRACT

A semiconductor storage device includes a plurality of word line layers stacked above one another in a first direction, a memory pillar having a columnar body penetrating the plurality of the word line layers, wherein each portion of the memory pillar intersecting the word line layers functions as a memory cell transistor, a source line layer to which an end of the memory pillar is connected, an acquisition circuit configured to acquire a voltage of the source line layer, and a first adjustment circuit configured to adjust the voltage of the source line layer to a predetermined target voltage based on the acquired voltage. The acquisition circuit includes a dummy pillar having a columnar body penetrating the plurality of word line layers and having an end connected to the source line layer, wherein each portion of the dummy pillar intersecting the word line layers functions as a dummy transistor.

15 Claims, 12 Drawing Sheets

(56) References Cited

U.S. PATENT DOCUMENTS

| | | | |
|---|---|---|---|
| 2020/0373321 A1* | 11/2020 | Kwak | G11C 16/24 |
| 2021/0066329 A1* | 3/2021 | Ito | G11C 5/06 |
| 2021/0082512 A1 | 3/2021 | Yamabe et al. | |

* cited by examiner

SEMICONDUCTOR STORAGE DEVICE ACQUIRING VOLTAGE FROM DUMMY PILLARS

CROSS-REFERENCE TO RELATED APPLICATION(S)

This application is based upon and claims the benefit of priority from Japanese Patent Application No. 2022-034959, filed Mar. 8, 2022, the entire contents of which are incorporated herein by reference.

FIELD

Embodiments described herein relate generally to a semiconductor storage device.

BACKGROUND

A semiconductor storage device such as a NAND flash memory includes a plurality of memory cell transistors that store data. The memory cell transistors are formed along a memory pillar that penetrates a plurality of word line layers. The ends of the memory pillars are connected to the source line layer.

DETAILED DESCRIPTION

Figure 1:
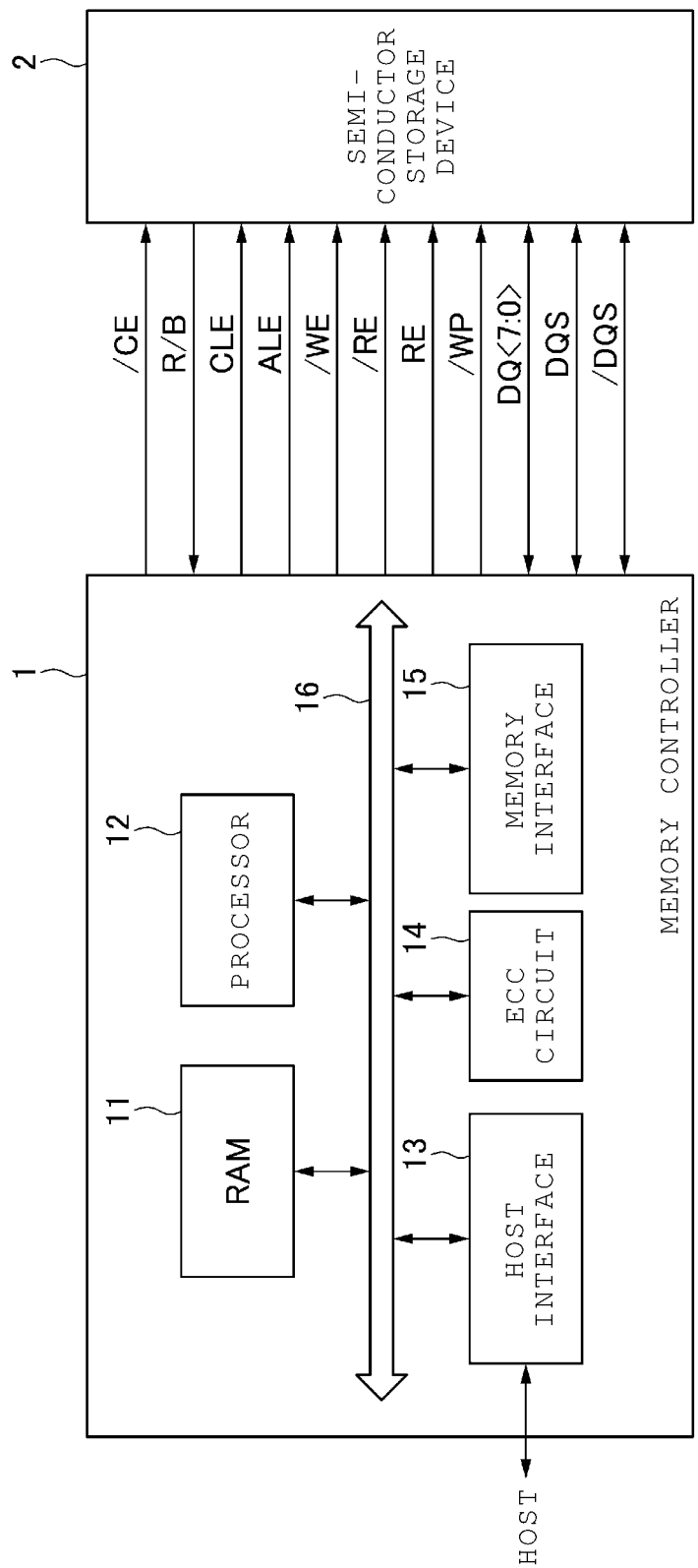
FIG. 1 is a block diagram showing a configuration example of a memory system according to an embodiment.

Embodiments provide a semiconductor storage device capable of appropriately adjusting the voltage of a source line layer.

In general, according to one embodiment, there is provided a semiconductor storage device including a plurality of word line layers stacked at intervals above one another in a first direction, a memory pillar having a columnar body penetrating the plurality of the word line layers, wherein each portion of the memory pillar intersecting the word line layers functions as a memory cell transistor, a source line layer to which an end of the memory pillar is connected, an acquisition circuit configured to acquire a voltage of the source line layer, and a first adjustment circuit configured to adjust the voltage of the source line layer to a predetermined target voltage based on the acquired voltage. The acquisition circuit includes a dummy pillar having a columnar body penetrating the plurality of word line layers and having an end connected to the source line layer, wherein each portion of the dummy pillar intersecting the word line layers functions as a dummy transistor.

Hereinafter, the present embodiment will be described with reference to the accompanying drawings. In order to facilitate understanding of the description, the same components are designated by the same reference numerals if possible in the drawings, and duplicate description is omitted.

A semiconductor storage device 2 according to the present embodiment is a non-volatile storage device configured with a NAND flash memory. FIG. 1 shows a configuration example of a memory system including the semiconductor storage device 2 as a block diagram. This memory system includes a memory controller 1 and the semiconductor storage device 2. Although a plurality of semiconductor storage devices 2 may actually be provided in the memory system of FIG. 1, one of the semiconductor storage devices 2 is simply shown in FIG. 1. The specific configuration of the semiconductor storage device 2 will be described later. This memory system can be connected to a host (not shown). The host is, for example, an electronic device such as a personal computer or a mobile terminal.

The memory controller 1 controls the writing of data to the semiconductor storage device 2 in response to a write request from the host. Further, the memory controller 1 controls reading of data from the semiconductor storage device 2 in response to a read request from the host.

Between the memory controller 1 and the semiconductor storage device 2, a chip enable signal /CE, a ready busy signal R/B, a command latch enable signal CLE, an address latch enable signal ALE, a write enable signal /WE, read enable signals /RE, RE, a write protect signal /WP, a data signal DQ<7:0>, and data strobe signals DQS, /DQS are transmitted and received.

The chip enable signal /CE is a signal for enabling the semiconductor storage device 2. The ready busy signal R/B is a signal for indicating whether the semiconductor storage device 2 is in a ready state or a busy state. The "ready state" is a state in which an external command can be accepted. The "busy state" is a state in which an external command cannot be accepted. The command latch enable signal CLE is a signal indicating that the data signal DQ<7:0> contains a command. The address latch enable signal ALE is a signal indicating that the data signal DQ<7:0> contains an address. The write enable signal /WE is a signal for indicating that the data signal DQ<7:0> should be received by the semiconductor storage device 2, and is asserted each time a command, an address, and data are transmitted to the memory controller 1 through the data signal DQ<7:0>. The memory controller 1 instructs the semiconductor storage device 2 to receive the data signal DQ<7:0> while the signal /WE is at the "L (Low)" state.

The read enable signal /RE is a signal for indicating to the semiconductor storage device 2 that the data signal DQ<7:0> should be transmitted by the semiconductor storage device 2. The signal RE is a complementary signal of the signal /RE. For example, the signals /RE and RE are used to control the operation timing of the semiconductor storage device 2 for outputting the data signal DQ<7:0>. The write protect signal /WP is a signal for instructing the semiconductor storage device 2 to prohibit data write and data erase. The data signal DQ<7:0> contains data transmitted and received between the semiconductor storage device 2 and the memory controller 1, and includes commands, addresses, and other data (e.g., user data). The data strobe signal DQS is a signal for controlling the input/output timing of the data signal DQ<7:0>. The signal /DQS is a complementary signal of the signal DQS.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other by an internal bus 16.

The host interface 13 outputs the request received from the host, user data (e.g., write data), and the like to the internal bus 16. Further, the host interface 13 transmits the user data read from the semiconductor storage device 2, the response from the processor 12, and the like to the host.

The memory interface 15 controls a process of writing user data or the like to the semiconductor storage device 2 and a process of reading the user data from the semiconductor storage device 2, based on the instruction of the processor 12.

The processor 12 controls the memory controller 1. The processor 12 is, for example, a CPU, an MPU, or the like. In response to receiving a request from the host via the host interface 13, the processor 12 performs control according to the request. For example, the processor 12 instructs the memory interface 15 to write user data and parity to the semiconductor storage device 2, in response to a request from the host. Further, the processor 12 instructs the memory interface 15 to read user data and parity from the semiconductor storage device 2, in response to a request from the host.

The processor 12 determines a storage region (also referred to herein as a memory region) on the semiconductor storage device 2, with respect to the user data stored in the RAM 11. The user data is stored in the RAM 11 via the internal bus 16. The processor 12 determines the memory region for write data that is in units of a page. The user data stored in one page of the semiconductor storage device 2 is also referred to as "unit data" below. The unit data is generally encoded and stored in the semiconductor storage device 2 as a codeword. In the present embodiment, encoding is optional and may be omitted. The memory controller 1 may store the unit data in the semiconductor storage device 2 without encoding, but FIG. 1 shows a configuration that performs encoding as a configuration example. When the memory controller 1 does not perform encoding, the page data matches the unit data. Further, one codeword may be generated based on one unit data, or one codeword may be generated based on the divided data obtained by dividing the unit data. Further, one codeword may be generated using a plurality of unit data.

The processor 12 determines the memory region of the semiconductor storage device 2, to which each unit data is written. A physical address is assigned to the memory region of the semiconductor storage device 2. The processor 12 manages the memory region to which the unit data is written, by using the physical address. The processor 12 designates the physical address and instructs the memory interface 15 to write user data to the semiconductor storage device 2. The processor 12 manages the correspondence between the logical address (e.g., logical address managed by the host) of the user data and the physical address. When receiving a read request including a logical address from the host, the processor 12 determines the physical address corresponding to the logical address, designates the physical address, and instructs the memory interface 15 to read the user data.

The ECC circuit 14 encodes the user data stored in the RAM 11 to generate a codeword. Further, the ECC circuit 14 decodes the code word read from the semiconductor storage device 2. The ECC circuit 14 detects an error in the data and corrects the error by using, for example, a parity assigned to the user data.

The RAM 11 temporarily stores the user data received from the host before being transmitted to the semiconductor storage device 2, or temporarily stores the data read from the semiconductor storage device 2 before being transmitted to the host. The RAM 11 is, for example, a general-purpose memory such as an SRAM or a DRAM.

FIG. 1 shows a configuration example in which the memory controller 1 includes an ECC circuit 14 and a memory interface 15. Alternatively, the ECC circuit 14 may be built in the memory interface 15. Further, the ECC circuit 14 may be built in the semiconductor storage device 2. The specific configuration and arrangement of each element shown in FIG. 1 are not limited to the particular configuration and arrangement shown in FIG. 1.

When a write request is received from the host, the memory system of FIG. 1 operates as follows. The processor 12 temporarily stores data that is the target of the write operation, in the RAM 11. The processor 12 reads the data stored in the RAM 11 and inputs the data to the ECC circuit 14. The ECC circuit 14 encodes the input data and inputs the codeword to the memory interface 15. The memory interface 15 writes the input codeword in the semiconductor storage device 2.

When a read request is received from the host, the memory system of FIG. 1 operates as follows. The memory interface 15 inputs a codeword read from the semiconductor storage device 2 to the ECC circuit 14. The ECC circuit 14 decodes the input codeword and stores the decoded data in the RAM 11. The processor 12 transmits the data stored in the RAM 11 to the host via the host interface 13.

Figure 2:
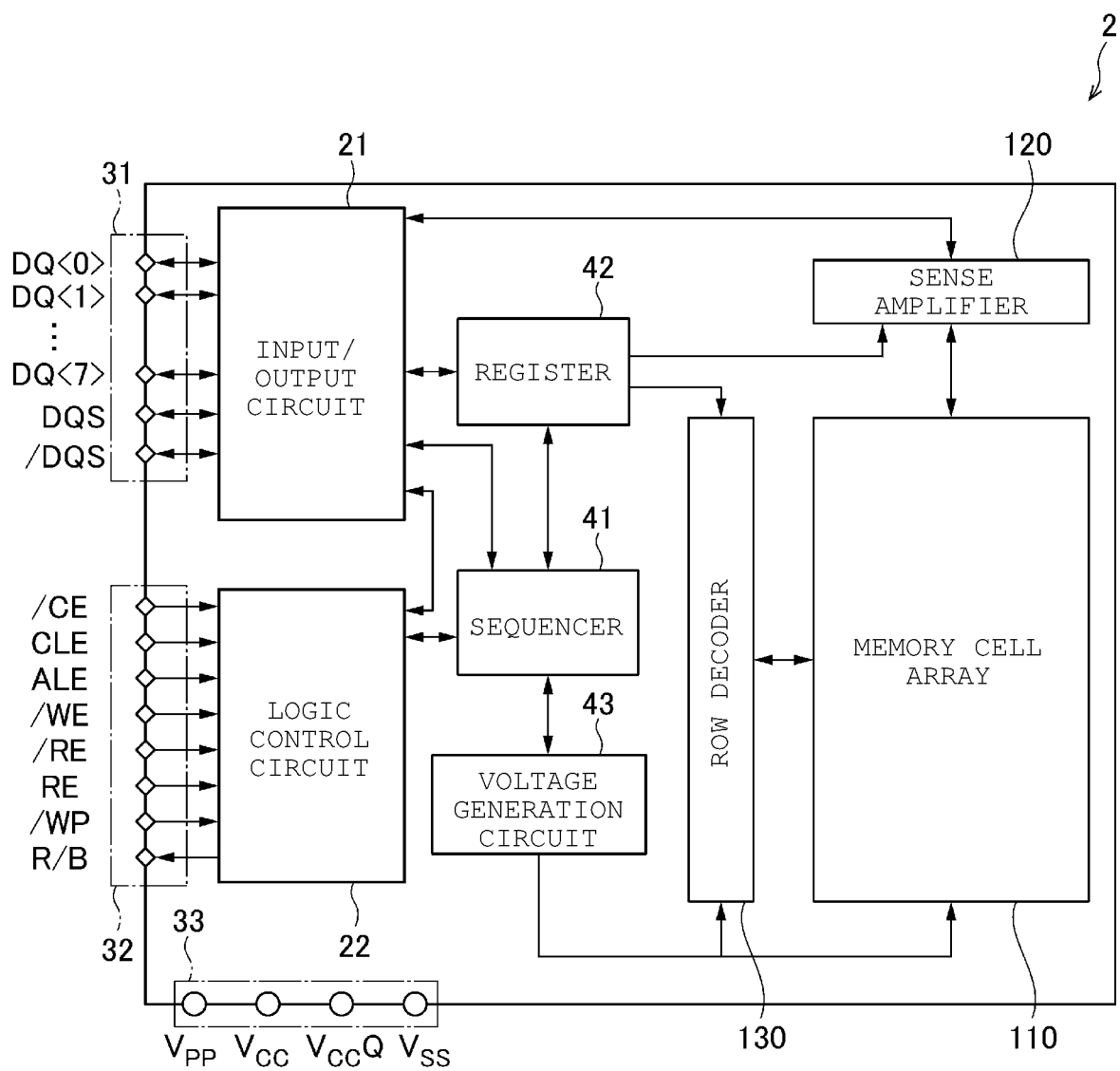
FIG. 2 is a block diagram showing a configuration of a semiconductor storage device according to the embodiment.

The configuration of the semiconductor storage device 2 will be described. As shown in FIG. 2, the semiconductor storage device 2 includes a memory cell array 110, a sense amplifier 120, a row decoder 130, an input/output circuit 21, a logic control circuit 22, a sequencer 41, a register 42, a voltage generation circuit 43, an input/output pad group 31, a logic control pad group 32, and a power input terminal group 33.

Figure 3:
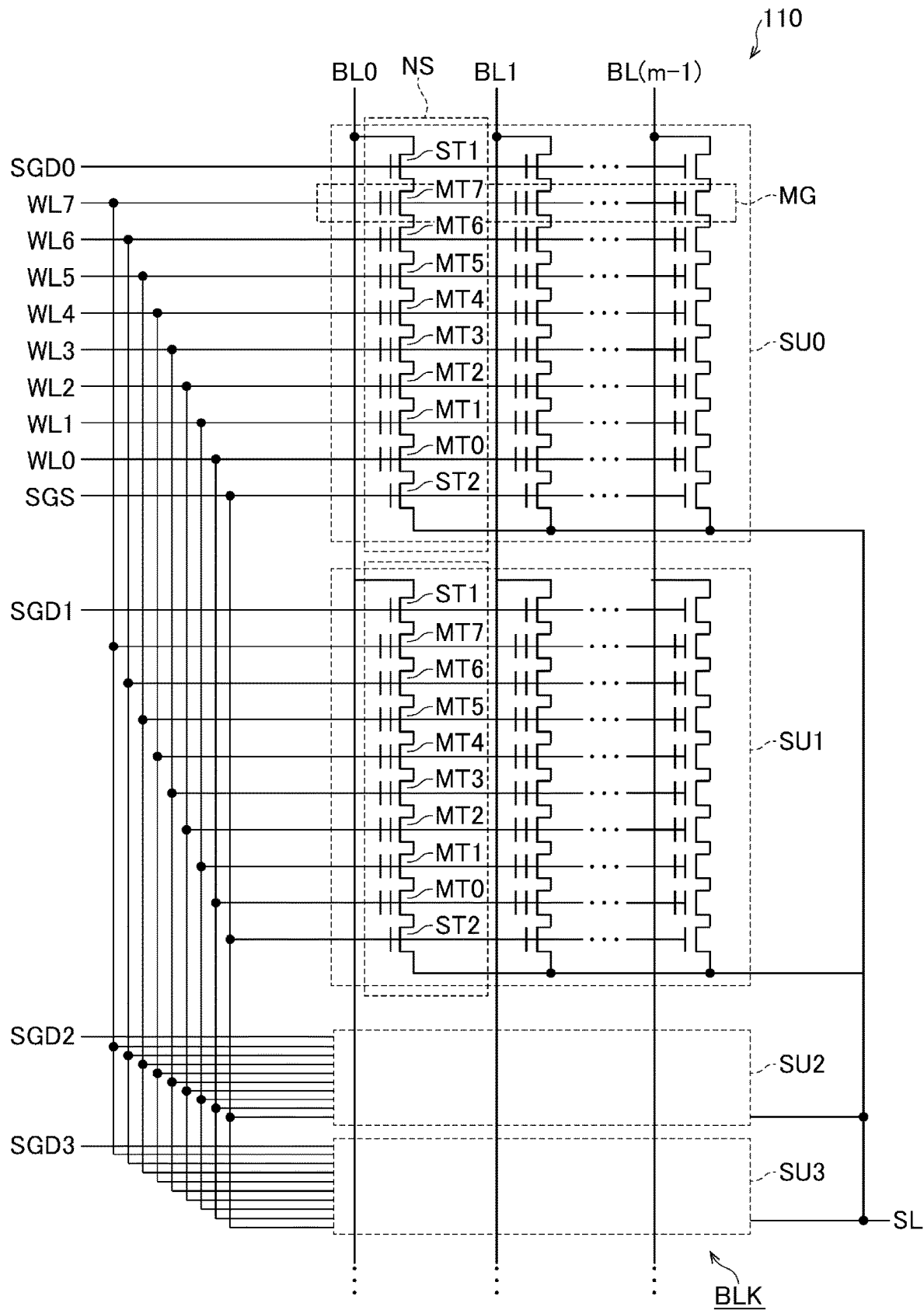
FIG. 3 is an equivalent circuit diagram showing a configuration of a memory cell array.

The memory cell array 110 is a part that stores data. FIG. 3 shows the configuration of the memory cell array 110 as an equivalent circuit diagram. The memory cell array 110 is configured with a plurality of blocks BLK, but in FIG. 3, one BLK of these blocks is shown. The configuration of the other block BLK provided in the memory cell array 110 is also the same as the configuration shown in FIG. 3.

As shown in FIG. 3, the block BLK includes, for example, four string units SU (SU0 to SU3). Further, each string unit SU includes a plurality of NAND strings NS. Each of the NAND strings NS includes, for example, eight memory cell transistors MT (MT0 to MT7) and select transistors ST1 and ST2.

The number of memory cell transistors MT is not limited to eight, and may be, for example, 32, 48, 64, or 96. For example, in order to improve the cutoff characteristic, each of the select transistors ST1 and ST2 may be configured with a plurality of transistors instead of a single transistor. Further, a dummy cell transistor may be provided between the memory cell transistors MT and the select transistors ST1 and ST2.

The memory cell transistors MT are located so as to be connected in series between the select transistor ST1 and the select transistor ST2. The memory cell transistor MT7 on one end side is connected to the source of the select transistor ST1, and the memory cell transistor MT0 on the other end side is connected to the drain of the select transistor ST2.

The gates of the select transistors ST1 of the string units SU0 to SU3 are commonly connected to the select gate lines SGD0 to SGD3, respectively. The gates of the select transistors ST2 are commonly connected to the same select gate line SGS across a plurality of string units SU in the same block BLK. The control gates of the memory cell transistors MT0 to MT7 in the same block BLK are commonly connected to the word lines WL0 to WL7, respectively. That is, the word lines WL0 to WL7 and the select gate line SGS are common among the plurality of string units SU0 to SU3 in the same block BLK, whereas the select gate line SGD is individually provided for each of the string units SU0 to SU3 even in the same block BLK.

The memory cell array 110 is provided with m bit lines BL (BL0, BL1, . . . , BL(m−1)). The "m" is an integer representing the number of NAND strings NS in one string unit SU. Of each NAND string NS, the drain of the select transistor ST1 is connected to the corresponding bit line BL. The source of the select transistor ST2 is connected to the source line SL. The source line SL is commonly connected to the sources of the plurality of select transistors ST2 provided in the block BLK.

The data stored in the plurality of memory cell transistors MT in the same block BLK are collectively erased. On the other hand, reading and writing of data are collectively performed for a plurality of memory cell transistors MT connected to one word line WL and belonging to one string unit SU. Each memory cell can store 3 bits of data including a higher bit, a middle bit, and a lower bit.

That is, the semiconductor storage device 2 according to the present embodiment employs a TLC method for storing 3-bit data in one memory cell transistor MT, as a method for writing data to the memory cell transistor MT. Instead, as the method for writing data to the memory cell transistor MT, an MLC method for storing 2-bit data in one memory cell transistor MT, an SLC method for storing 1-bit data in one memory cell transistor MT, or the like may be adopted.

In the following description, a set of 1-bit data stored by a plurality of memory cell transistors MT connected to one word line WL and belonging to one string unit SU is referred to as a "page". In FIG. 3, the reference numeral "MG" is attached to one of the sets of memory cell transistors MT described above.

When 3-bit data is stored in one memory cell transistor MT as in the present embodiment, a set of memory cell transistors MT connected to a common word line WL in one string unit SU can store data for 3 pages.

Figure 4:
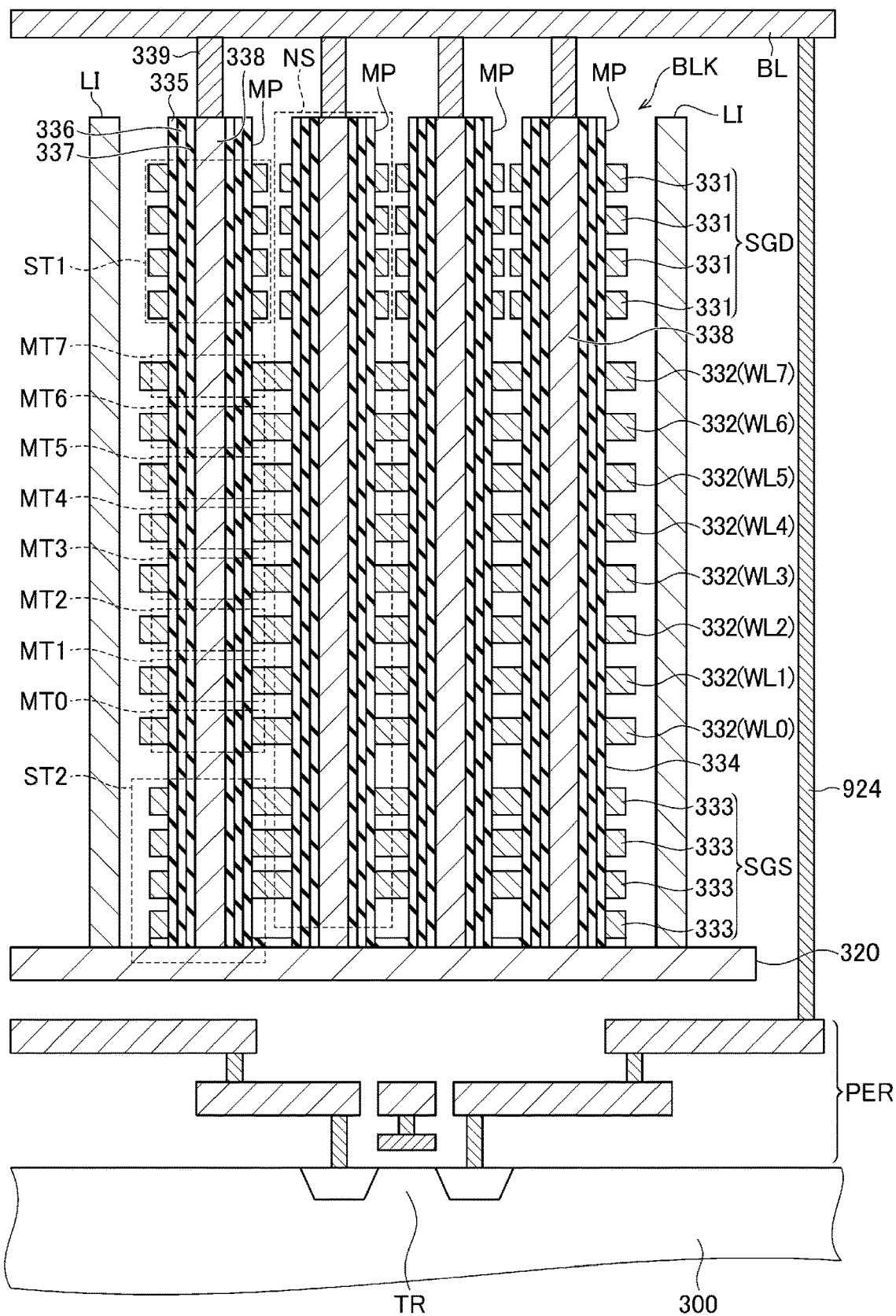
FIG. 4 is a cross-sectional view showing the configuration of the memory cell array.

FIG. 4 schematically shows a cross section when the memory cell array 110 is cut along the direction in which the bit line BL extends. As shown in FIG. 4, in the memory cell array 110, a plurality of NAND strings NS are formed on a source line layer 320. The source line layer 320 is also referred to as a buried source line (BSL) and corresponds to the source line SL in FIG. 3. The source line layer 320 is formed of, for example, polysilicon.

Above the source line layer 320, a plurality of wiring layers 333 functioning as select gate lines SGS, a plurality of wiring layers 332 functioning as word lines WL, and a plurality of wiring layers 331 functioning as select gate lines SGD are stacked. These wiring layers are stacked so as to be lined up vertically at intervals from each other. An insulating layer (not shown) is disposed between each of the stacked wiring layers 333, 332, and 331. In the present embodiment, each of the plurality of word lines WL is formed as a layered wiring layer 332 as described above. The wiring layer 332 corresponds to the "word line layer" in the present embodiment.

A plurality of memory holes 334 are formed in the memory cell array 110. The memory hole 334 is a hole that penetrates the wiring layers 333, 332, and 331, and an insulating layer (not shown) between the wiring layers in the vertical direction and reaches the source line layer 320. A block insulating film 335, a charge storage layer 336, and a gate insulating film 337 are sequentially formed on the side surface of the memory hole 334, and a conductive column 338 is further embedded in the block insulating film 335, the charge storage layer 336, and the gate insulating film 337. The conductive column 338 is made of polysilicon, for example, and functions as a region where channels are formed during the operation of the memory cell transistors MT and the select transistors ST1 and ST2 in the NAND string NS. As described above, a columnar body including the block insulating film 335, the charge storage layer 336, the gate insulating film 337, and the conductive column 338 is formed in the memory hole 334. This columnar body is also referred to as "memory pillar MP" below. The memory pillars MP penetrate the wiring layers 333, 332, and 331 vertically, and the lower ends thereof are connected to the source line layer 320.

Of the memory pillar MPs formed in the memory hole 334, each portion intersecting each of the stacked wiring layers 333, 332, and 331 functions as a transistor. Among the plurality of transistors, the transistors in the portion intersecting with the wiring layers 331 function as the select transistors ST1. Among the plurality of transistors, the transistors in the portion intersecting with the wiring layers 332 function as memory cell transistors MT (MT0 to MT7). Among the plurality of transistors, the transistors in the portion intersecting with the wiring layers 333 function as the select transistors ST2. With such a configuration, each of the memory pillars MPs formed in each memory hole 334 functions as the NAND string NS described with reference to FIG. 3. The conductive column 338 in the memory pillar MP is a portion that functions as a channel of the memory cell transistor MT and the select transistors ST1 and ST2.

A wiring layer that functions as a bit line BL is formed above the conductive column 338. A contact plug 339 for connecting the conductive column 338 and the bit line BL is formed at the upper end of the conductive column 338. Each bit line BL is a conductor extending in a direction intersecting the direction in which the plurality of wiring layers 332 and the like are stacked (left-right direction in FIG. 4), and is connected to the end of the memory pillar MP opposite to the source line layer 320 via a contact plug 339, as described above.

A plurality of configurations similar to the configuration shown in FIG. 4 are present along the depth direction of the paper surface of FIG. 4. One string unit SU is formed by a set of a plurality of NAND strings NS lined up along the depth direction of the paper surface of FIG. 4.

The plurality of memory pillar MPs shown in FIG. 4 belong to the same block BLK. The other block BLKs in the memory cell array 110 are disposed on the left and right sides of the block BLK shown in FIG. 4, but the illustration thereof is omitted in FIG. 4. The arrangement of the plurality of blocks BLK will be described later with reference to FIG. 9 and the like.

A conductor LI is disposed between the blocks BLK adjacent to each other. The conductor LI is a conductor formed in a flat plate shape extending along the depth direction of the paper surface of FIG. 4, and partitions the blocks BLK. The lower end of the conductor LI is connected to the source line layer 320. The upper end of the conductor LI is connected to a wiring layer (not shown).

In the semiconductor storage device 2 according to the present embodiment, a peripheral circuit PER is provided between the source line layer 320 and a semiconductor substrate 300, that is, at a position opposite to the memory pillar MP with respect to the source line layer 320. The peripheral circuit PER is a circuit for controlling the operation of the memory cell transistor MT, such as a write operation, a read operation, an erase operation. The sense amplifier 120, the row decoder 130, the voltage generation circuit 43, and the like shown in FIG. 2 are part of the peripheral circuit PER. The peripheral circuit PER includes various transistors, an RC circuit, and the like. In the example shown in FIG. 4, the transistor TR formed on the semiconductor substrate 300 and the bit line BL above the memory cell array 110 are electrically connected to the peripheral circuit PER via the contact 924.

Instead of such a configuration, the memory cell array 110 may be provided directly on the semiconductor substrate 300. In this case, a p-type well region on the semiconductor substrate 300 functions as a source line SL, that is, a source line layer. Further, the peripheral circuit PER is provided at a position adjacent to the memory cell array 110 along the upper surface of the semiconductor substrate 300.

The explanation will be continued by returning to FIG. 2. The sense amplifier 120 is a circuit for adjusting the voltage applied to the bit line BL during writing or reading the voltage of the bit line BL to convert the voltage into data. During data read, the sense amplifier 120 acquires the data stored in the memory cell transistor MT based on the voltage of the bit line BL, and transfers the acquired data to the input/output circuit 21. During data write, the sense amplifier 120 writes data into the memory cell transistor MT by adjusting the voltage applied to the bit line BL. The operation of the sense amplifier 120 is controlled by the sequencer 41 described later.

Figure 5:
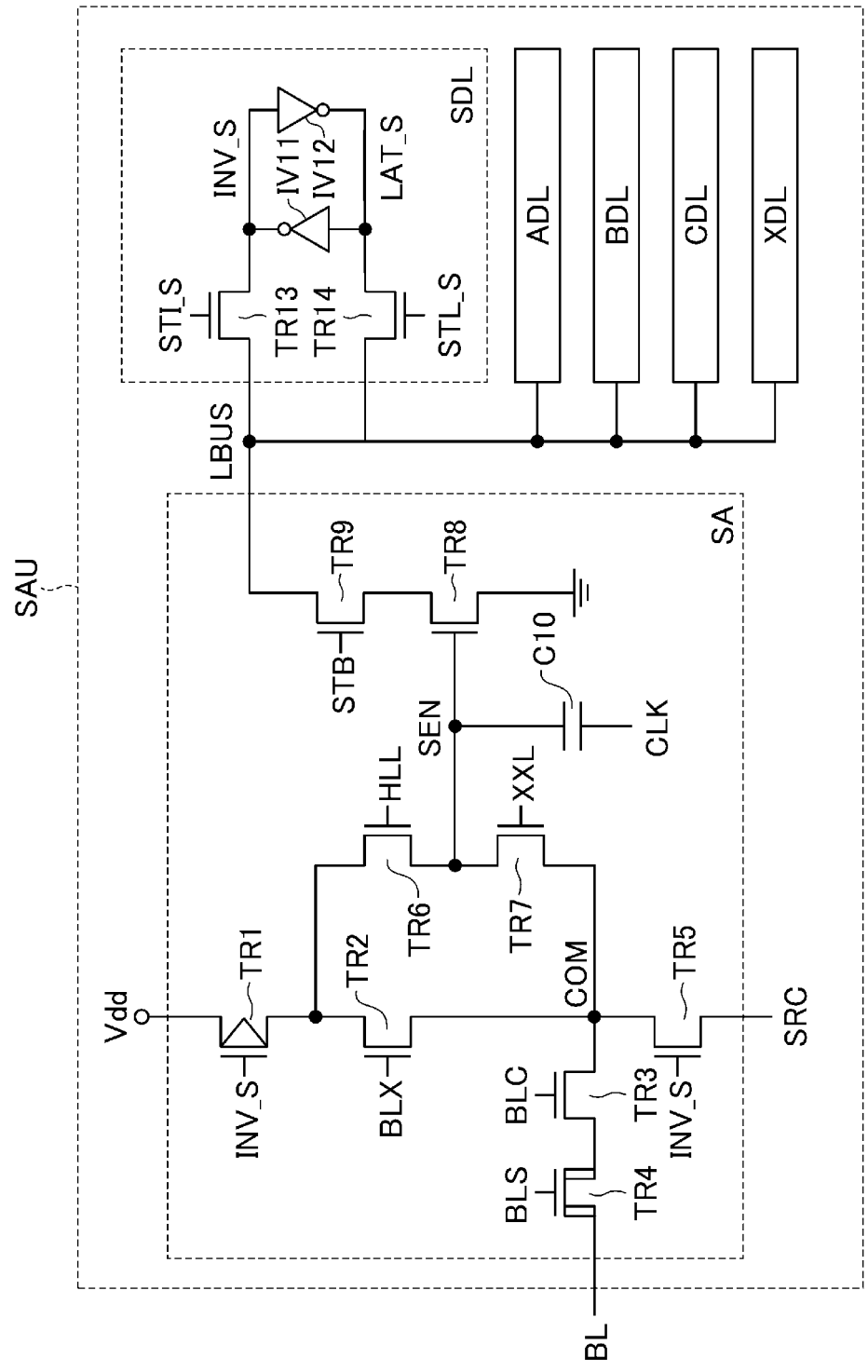
FIG. 5 is a diagram showing a circuit configuration of a sense amplifier unit.

The sense amplifier 120 includes a plurality of sense amplifier units SAU respectively corresponding to the plurality of bit lines BL. One sense amplifier unit SAU is connected to one bit line BL. That is, it can be said that the sense amplifier unit SAU is a circuit connected to the memory cell transistors MTs of the string unit SU via the bit line BL. FIG. 5 shows the detailed circuit configuration of one sense amplifier unit SAU.

As shown in FIG. 5, the sense amplifier unit SAU includes a sense amplifier unit SA and latch circuits SDL, ADL, BDL, CDL, and XDL. The sense amplifier unit SA and the latch circuits SDL, ADL, BDL, CDL, and XDL are connected by a bus LBUS by which data can be transmitted and received between each other.

For example, in the read operation, the sense amplifier unit SA senses the corresponding bit line BL to determine whether the data stored in the memory cell transistor MT that is a read target is "0" or "1". The sense amplifier unit SA includes, for example, a transistor TR1 that is a p-channel MOS transistor, transistors TR2 to TR9 that are n-channel MOS transistors, and a capacitor C10.

One end of the transistor TR1 is connected to the power supply line, and the other end of the transistor TR1 is connected to the transistor TR2. The gate of the transistor TR1 is connected to the node INV_S in the latch circuit SDL. One end of the transistor TR2 is connected to the transistor TR1, and the other end of the transistor TR2 is connected to the node COM. The signal BLX is input to the gate of the transistor TR2. One end of the transistor TR3 is connected to the node COM, and the other end of the transistor TR3 is connected to the transistor TR4. The signal BLC is input to the gate of the transistor TR3. The transistor TR4 is a high-breakdown-voltage MOS transistor. One end of the transistor TR4 is connected to the transistor TR3. The other end of the transistor TR4 is connected to the corresponding bit line BL. The signal BLS is input to the gate of the transistor TR4.

One end of the transistor TR5 is connected to the node COM, and the other end of the transistor TR5 is connected to the node SRC. The gate of the transistor TR5 is connected to the node INV_S. One end of the transistor TR6 is connected between the transistor TR1 and the transistor TR2, and the other end of the transistor TR6 is connected to the node SEN. The signal HLL is input to the gate of the transistor TR6. One end of the transistor TR7 is connected to the node SEN, and the other end of the transistor TR7 is connected to the node COM. The signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

Signals BLX, BLC, BLS, HLL, XXL, and STB are generated by, for example, the sequencer 41. Further, for example, the voltage Vdd which is the internal power supply voltage of the semiconductor storage device 2 is applied to the power supply line connected to one end of the transistor TR1, and the voltage Vss which is the ground voltage of the semiconductor storage device 2 is applied to the node SRC, for example.

The latch circuits SDL, ADL, BDL, CDL, and XDL temporarily store read data and write data. The latch circuit XDL is connected to the input/output circuit 21 and is used for data input/output between the sense amplifier unit SAU and the input/output circuit 21.

The latch circuit SDL includes, for example, inverters IV11 and IV12 and transistors TR13 and TR14 which are n-channel MOS transistors. The input node of the inverter IV11 is connected to the node LAT_S. The output node of the inverter IV11 is connected to the node INV_S. The input node of the inverter IV12 is connected to the node INV_S. The output node of the inverter IV12 is connected to the node LAT_S. One end of the transistor TR13 is connected to the node INV_S, and the other end of the transistor TR13 is connected to the bus LBUS. The signal STI_S is input to the gate of the transistor TR13. One end of the transistor TR14 is connected to the node LAT_S, and the other end of the transistor TR14 is connected to the bus LBUS. The signal STL_S is input to the gate of the transistor TR14. For example, the data stored in the node LAT_S corresponds to the data stored in the latch circuit SDL. Further, the data stored in the node INV_S corresponds to the inverted data of the data stored in the node LAT_S. Since the circuit configuration of the latch circuits ADL, BDL, CDL, and XDL is the same as the circuit configuration of the latch circuit SDL, the description thereof will be omitted.

The explanation will be continued by returning to FIG. 2. The row decoder 130 is a circuit configured with a switch group (not shown) for applying a voltage to each of the word line WLs. The row decoder 130 receives the block address and the row address from the register 42, selects the corresponding block BLK based on the block address, and selects the corresponding word line WL based on the row address. The row decoder 130 switches the ON/OFF state of the above switch group such that the voltage from the voltage generation circuit 43 is applied to the selected word line WL. The operation of the row decoder 130 is controlled by the sequencer 41.

The input/output circuit 21 transmits and receives the data signal DQ<7:0> and the data strobe signals DQS, /DQS to and from the memory controller 1. The input/output circuit 21 transfers the command and the address in the data signal DQ<7:0> to the register 42. Further, the input/output circuit 21 transmits and receives write data and read data to and from the sense amplifier 120.

The logic control circuit 22 receives the chip enable signal /CE, a command latch enable signal CLE, the address latch enable signal ALE, the write enable signal /WE, read enable signals RE, /RE, and the write protect signal /WP, from the memory controller 1. Further, the logic control circuit 22 transfers the ready busy signal R/B to the memory controller 1 and transmits a notification of the state of the semiconductor storage device 2 to the outside.

The sequencer 41 controls the operation of each part including the memory cell array 110, based on the control signal input from the memory controller 1 to the logic control circuit 20. The sequencer 41 is a control circuit that controls the overall operation of the semiconductor storage device 10.

The register 42 is a part that temporarily stores a command or an address. The register 42 stores a command instructing a write operation, a read operation, an erase operation, or the like. The command is input from the memory controller 1 to the input/output circuit 21, and then transferred from the input/output circuit 21 to the register 42 and stored.

The register 42 also stores the address corresponding to the above command. The address is input from the memory controller 1 to the input/output circuit 21, and then transferred from the input/output circuit 21 to the register 42 and stored.

Further, the register 42 also stores status information indicating the operating state of the semiconductor storage device 2. The status information is updated by the sequencer 41 each time according to the operating state of the memory cell array 110 or the like. The status information is output from the input/output circuit 21 to the memory controller 1 as a status signal in response to a request from the memory controller 1.

The voltage generation circuit 43 is a part that generates a voltage required for each of a write operation, a read operation, and an erase operation of data in the memory cell array 110. Such a voltage includes, for example, a voltage applied to each word line WL, a voltage applied to each bit line BL, and the like. The operation of the voltage generation circuit 43 is controlled by the sequencer 41.

The input/output pad group 31 is a portion provided with a plurality of terminals (pads) for transmitting and receiving each signal between the memory controller 1 and the input/output circuit 21. Each terminal is individually provided corresponding to each of the data signal DQ<7:0> and the data strobe signals DQS and /DQS.

The logic control pad group 32 is a portion provided with a plurality of terminals (pads) for transmitting and receiving each signal between the memory controller 1 and the logic control circuit 22. A terminal is individually provided corresponding to each of the chip enable signal /CE, the command latch enable signal CLE, the address latch enable signal ALE, the write enable signal /WE, the read enable signals RE, /RE, the write protect signal /WP, and the ready busy signal R/B.

The power input terminal group 33 is a portion provided with a plurality of terminals for receiving the application of each voltage necessary for the operation of the semiconductor storage device 2. The voltage applied to each terminal includes the power supply voltages Vcc, VccQ, and Vpp, and the ground voltage Vss.

The power supply voltage Vcc is a circuit power supply voltage supplied from the outside as an operating power supply, and is, for example, a voltage of about 3.3 V. The power supply voltage VccQ is, for example, a voltage of 1.2 V. The power supply voltage VccQ is a voltage used when transmitting and receiving signals between the memory controller 1 and the semiconductor storage device 2. The power supply voltage Vpp is a power supply voltage higher than the power supply voltage Vcc, and is, for example, a voltage of 12 V.

When data is written to the memory cell array 110 or data is erased, a high voltage of about 20 V is required. At this time, a desired voltage can be generated at high speed and low power consumption by boosting the power supply voltage Vpp of about 12 V rather than boosting the power supply voltage Vcc of about 3.3 V by the boosting circuit of the voltage generation circuit 43. On the other hand, for example, when the semiconductor storage device 2 is used in an environment where a high voltage cannot be supplied, the power supply voltage Vpp may not be supplied. Even when the power supply voltage Vpp is not supplied, the semiconductor storage device 2 can execute various operations as long as the power supply voltage Vcc is supplied. That is, the power supply voltage Vcc is a power supply that is supplied to the semiconductor storage device 2 as standard, and the power supply voltage Vpp is an additional or a certain power supply that is supplied according to, for example, the usage environment.

Figure 6:
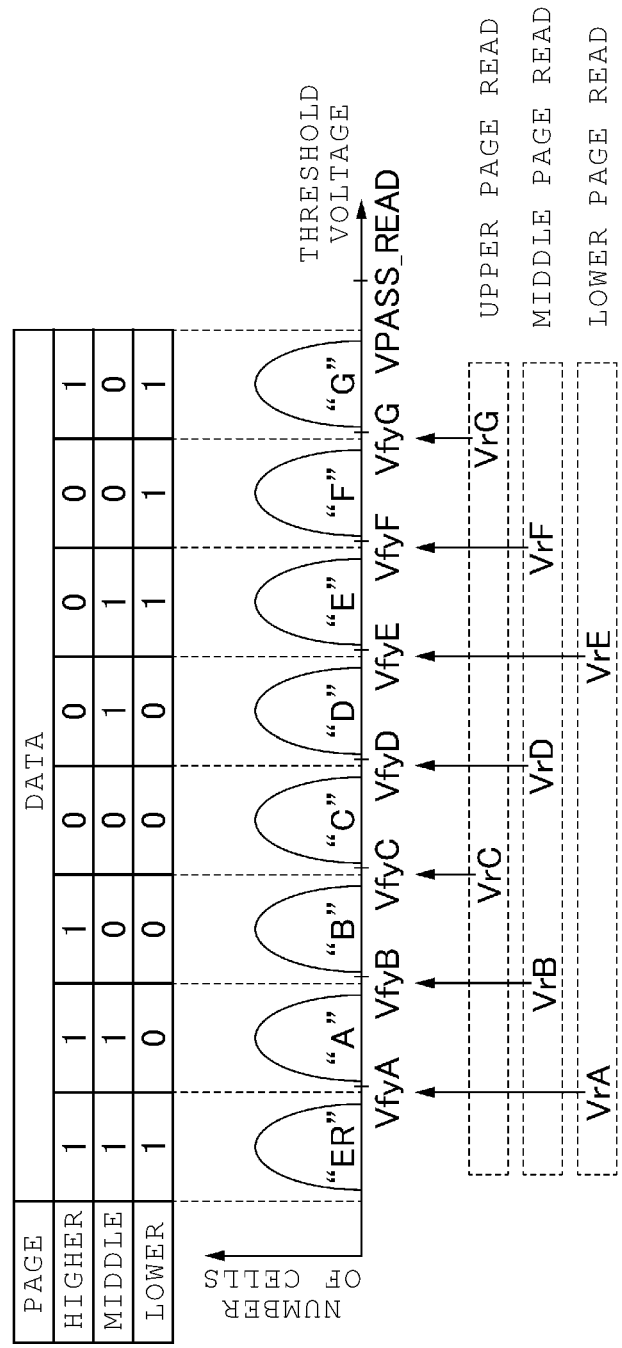
FIG. 6 is a diagram showing an example of a threshold voltage distribution of a memory cell transistor.

FIG. 6 is a diagram schematically showing the threshold voltage distribution and the like of the memory cell transistor MT. The figure in the middle of FIG. 6 shows the correspondence between the threshold voltage (horizontal axis) of the memory cell transistor MT and the number of memory cell transistors MT (vertical axis).

When the TLC method is adopted as in the present embodiment, the plurality of memory cell transistors MT form eight threshold voltage distributions as shown in the middle of FIG. 6. These eight threshold voltage distributions are respectively referred to as "ER" state, "A" state, "B" state, "C" state, "D" state, "E" state, "F" state, and "G" state, in order from the lowest threshold voltage.

The table at the top of FIG. 6 shows an example of data assignment corresponding to each of the above states of the threshold voltage. As shown in the table, for example, different 3-bit data pieces are assigned to "ER" state, "A" state, "B" state, "C" state, "D" state, "E" state, "F" state, and "G" state, as shown below.

"ER" state: "111" ("lower bit/middle bit/higher bit")
"A" state: "011"
"B" state: "001"

"C" state: "000"
"D" state: "010"
"E" state: "110"
"F" state: "100"
"G" state: "101"

A verification voltage to be used in each write operation is set between a pair of threshold voltage distributions adjacent to each other. Specifically, the verification voltages VfyA, VfyB, VfyC, VfyD, VfyE, VfyF, and VfyG are set corresponding to "A" state, "B" state, "C" state, "D" state, "E" state, "F" state, and "G" state, respectively.

The verification voltage VfyA is set between the maximum threshold voltage at the "ER" state and the minimum threshold voltage at the "A" state. When the verification voltage VfyA is applied to the word line WL, among the memory cell transistors MT connected to the word line WL, the memory cell transistor MT of which the threshold voltage is in the "ER" state is turned on, and the memory cell transistor MT in the threshold voltage distribution of which a threshold voltage is "A" state or higher is turned off.

Other verification voltages VfyB, VfyC, VfyD, VfyE, VfyF, and VfyG are also set in the same manner as the above verification voltage VfyA. The verification voltage VfyB is set between the "A" state and the "B" state; the verification voltage VfyC is set between the "B" state and the "C" state; the verification voltage VfyD is set between the "C" state and the "D" state; the verification voltage VfyE is set between the "D" state and the "E" state; the verification voltage VfyF is set between the "E" state and the "F" state; and the verification voltage VfyG is set between the "F" state and the "G" state.

For example; the verification voltage VfyA may be set to 0.8 V; the verification voltage VfyB may be set to 1.6 V; the verification voltage VfyC may be set to 2.4 V; the verification voltage VfyD may be set to 3.1 V; the verification voltage VfyE may be set to 3.8 V; the verification voltage VfyF may be set to 4.6 V; and the verification voltage VfyG may be set to 5.6 V. However, without being limited to this, the verification voltages VfyA, VfyB, VfyC, VfyD, VfyE, VfyF, and VfyG may be appropriately and stepwise set in the range of, for example, 0 V to 7.0 V.

Further, a read voltage to be used in each read operation is set between adjacent threshold voltage distributions. The "read voltage" is a voltage applied to the word line WL connected to the memory cell transistor MT that is the target of the read operation, that is, the selected word line, during the read operation. In the read operation, data is determined based on a determination result of whether the threshold voltage of the memory cell transistor MT that is the target of the read operation is higher than the applied read voltage.

As schematically shown in the lower figure of FIG. 6, specifically, the read voltage VrA for determining whether the threshold voltage of the memory cell transistor MT is in the "ER" state or the "A" state or higher is set between the maximum threshold voltage at the "ER" state and the minimum threshold voltage at the "A" state.

Other read voltages VrB, VrC, VrD, VrE, VrF, and VrG are also set similar to the read voltage VrA. The read voltage VrB is set between the "A" state and the "B" state; the read voltage VrC is set between the "B" state and the "C" state; the read voltage VrD is set between the "C" state and the "D" state; the read voltage VrE is set between the "D" state and the "E" state; the read voltage VrF is set between the "E" state and the "F" state; and the read voltage VrG is set between the "F" state and the "G" state.

A read pass voltage VPASS_READ is set to a voltage higher than the maximum threshold voltage of the highest threshold voltage distribution (for example, "G" state). A memory cell transistor MT is turned on regardless of the data stored therein if the read pass voltage VPASS_READ is applied to the gate thereof.

The verification voltages VfyA, VfyB, VfyC, VfyD, VfyE, VfyF, and VfyG are set to higher voltages than, for example, the read voltages VrA, VrB, VrC, VrD, VrE, VrF, and VrG, respectively. That is, the verification voltages VfyA, VfyB, VfyC, VfyD, VfyE, VfyF, and VfyG are set near the lower boundary of the "A" state, "B" state, "C" state, "D" state, "E" state, "F" state, and "G" state, respectively.

When the data assignment as described above is applied, the one-page data (lower page data) of the lower bit in the read operation can be determined based on the read result using the read voltages VrA and VrE. The one-page data of the middle bit (middle page data) can be determined based on the read result using the read voltages VrB, VrD, and VrF. The one-page data of the higher bit (upper page data) can be determined based on the read result using the read voltages VrC and VrG. In this way, the lower page data, the middle page data, and the upper page data are determined by the read operations carried out twice, three times, and twice, respectively. Therefore, the above data assignment is called "2-3-2 code".

The data assignment as described above is only an example, and the actual data assignment is not limited to this. For example, 2 bits or 4 or more bits of data may be stored in one memory cell transistor MT. Further, the number of threshold voltage distributions to which data is assigned may be 7 or less, or 9 or more. In addition, "1-3-3 code" or "1-2-4 code" may be used instead of "2-3-2 code". Further, for example, the assignment of the lower bit/middle bit/higher bit may be changed. For example, in the "2-3-2 code", data may be assigned in a manner that the lower page data is determined based on the read result using the read voltages VrC and VrB, the middle page data is determined based on the read result using the read voltages VrB, VrD and VrF, and the upper page data is determined based on the read result using the read voltages VrA and VrE. That is, the assignment of the lower bit and the higher bit may be exchanged. In this case, data is assigned as follows.

"ER" state: "111" ("lower bit/middle bit/higher bit")
"A" state: "110"
"B" state: "100"
"C" state: "000"
"D" state: "010"
"E" state: "011"
"F" state: "001"
"G" state: "101"

The write operation performed in the semiconductor storage device 2 will be described. In the write operation, a program operation and a verification operation are performed. The "program operation" is an operation of changing the threshold voltage of the memory cell transistor MT by injecting electrons into the charge storage layer 336 of some memory cell transistors MT. The "verification operation" is an operation of determining and verifying whether the threshold voltage of the memory cell transistor MT reaches the target state by reading data after the above program operation. The memory cell transistor MT of which threshold voltage reaches the target state is subsequently write-inhibited.

In the write operation, the above program operation and verification operation are repeatedly executed. Thus, the threshold voltage of the memory cell transistor MT rises to the target state.

Among the plurality of word lines WLs, the word line WL connected to the memory cell transistor MT that is the target of the write operation (that is, the target for changing the threshold voltage) is also referred to as "selected word line" below. Further, the word line WL connected to the memory cell transistor MT that is the target of the write operation is also referred to as "non-selected word line" below.

Among the plurality of string units SUs, the string unit SU that is the target of the write operation is also referred to as a "selected string unit" below. Further, the string unit SU that is not the target of the write operation is also referred to as a "non-selected string unit" below.

Figure 7:
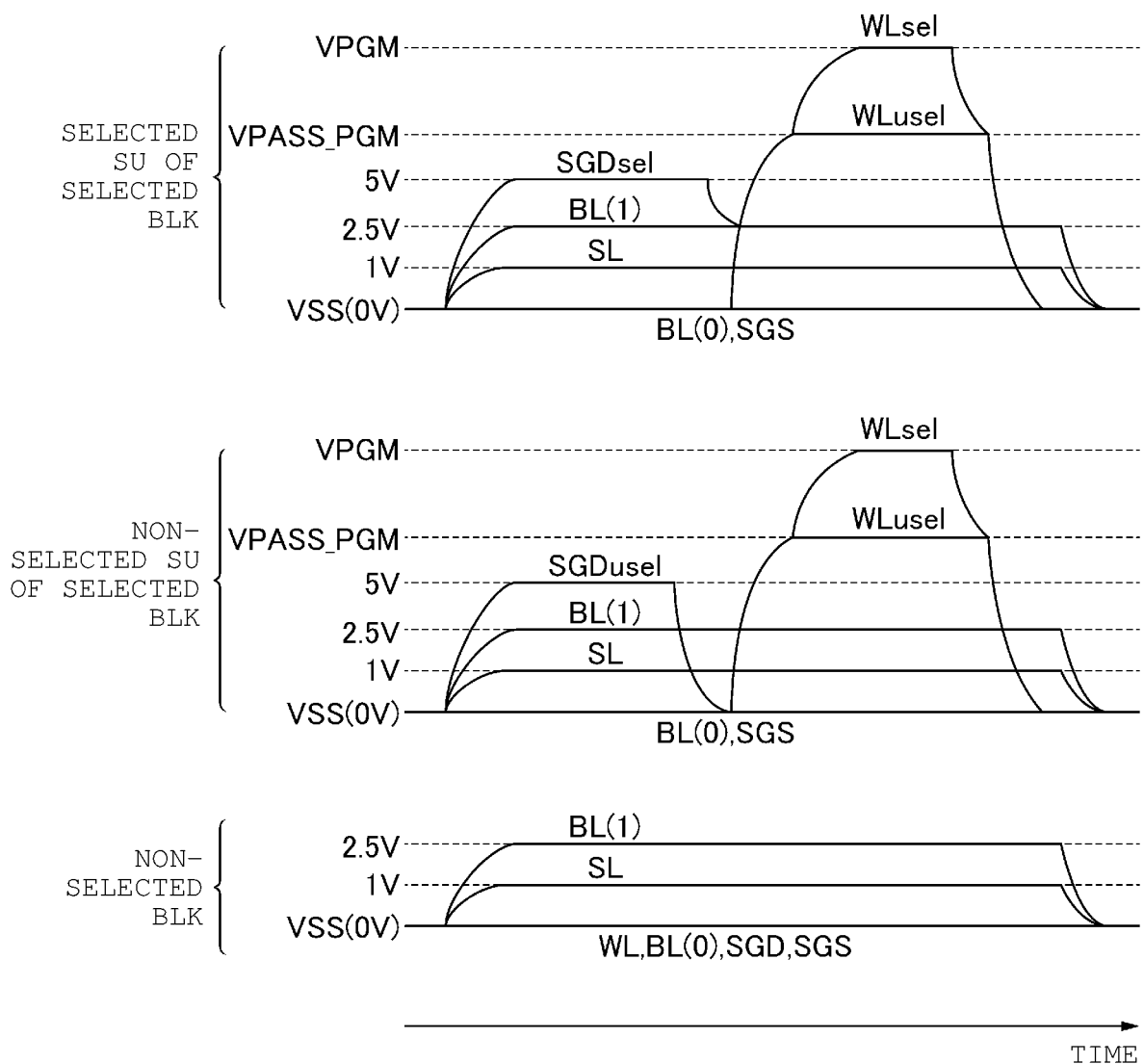
FIG. 7 is a diagram showing a voltage change of each wiring during a write operation.

The program operation will be described. FIG. 7 shows the voltage change of each wiring during the program operation. In the program operation, the sense amplifier 120 changes the voltage of each bit line BL corresponding to the program data. For example, a ground voltage Vss (0 V) is applied as the "L" state to the bit line BL connected to the memory cell transistor MT that is the target of the program operation (to raise the threshold voltage). For example, 2.5 V is applied as the "H" state to the bit line BL connected to the memory cell transistor MT that is not the target of program operation (to maintain the threshold voltage). The former bit line BL is described as "BL(0)" in FIG. 7. The latter bit line BL is described as "BL(1)" in FIG. 7.

The row decoder 130 selects any block BLK as the target of the write operation, and further selects any string unit SU. More specifically, for example, 5 V is applied from the voltage generation circuit 43 to the select gate line SGD in the selected string unit SU (selected select gate line SGDsel) via the row decoder 130. Thus, the select transistor ST1 is turned on. On the other hand, for example, voltage Vss is applied to the select gate line SGS from the voltage generation circuit 43 via the row decoder 130. Thus, the select transistor ST2 is turned off.

Further, for example, a voltage of 5 V is applied from the voltage generation circuit 43 to the select gate line SGD of the non-selected string unit SU in the selected block BLK (non-selected select gate line SGDusel) via the row decoder 130. Thus, the select transistor ST1 is turned on. In the string unit SU in each block BLK, the select gate line SGS is commonly connected. Therefore, even in the non-selected string unit SU, the select transistor ST2 is turned off.

Further, for example, a voltage Vss is applied from the voltage generation circuit 43 to the select gate line SGD and the select gate line SGS in the non-selected block BLK via the row decoder 130. Thus, the select transistor ST1 and the select transistor ST2 are turned off.

The source line SL has a voltage higher than the voltage of the select gate line SGS. The voltage is, for example, 1 V.

After that, the voltage of the selected select gate line SGDsel in the selected block BLK is set to, for example, 2.5 V. This voltage is a voltage to turn on the select transistor ST1 corresponding to the bit line BL(0) supplied with 0 V but to cut off the select transistor ST1 corresponding to the bit line BL(1) supplied with 2.5 V in the above example. Thus, in the selected string unit SU, the select transistor ST1 corresponding to the bit line BL(0) is turned on, and the select transistor ST1 corresponding to the bit line BL(1) supplied with 2.5 V is cut off. On the other hand, the voltage of the non-selected select gate line SGDusel is, for example, a voltage Vss. Thus, in the non-selected string unit SU, the select transistor ST1 is cut off regardless of the voltages of the bit line BL(0) and the bit line BL(1).

Then, the row decoder 130 selects any word line WL as the target of the write operation, in the selected block BLK. For example, a voltage VPGM is applied from the voltage generation circuit 43 to the word line WL that is the target of the write operation (selected word line WLsel) via the row decoder 130. On the other hand, for example, the voltage VPASS_PGM is applied from the voltage generation circuit 43 to the other word lines WL (non-selected word lines WLusel) via the row decoder 130. The voltage VPGM is a high voltage for injecting electrons into the charge storage layer 336 via the tunnel phenomenon. The voltage VPASS_PGM is a voltage that does not change the threshold voltage while turning on the memory cell transistor MT connected to the word line WL. VPGM is a higher voltage than VPASS_PGM.

In the NAND string NS corresponding to the bit line BL(0) that is the target of the program operation, the select transistor ST1 is turned on. Therefore, the channel voltage of the memory cell transistor MT connected to the selected word line WLsel becomes 0 V. The voltage difference between the control gate and the channel becomes large, and as a result, electrons are injected into the charge storage layer 336, so that the threshold voltage of the memory cell transistor MT is raised.

In the NAND string NS corresponding to the bit line BL(1) that is not the target of the program operation, the select transistor ST1 is in the cutoff state. Therefore, the channel of the memory cell transistor MT connected to the selected word line WLsel goes into an electrically floating state, and the channel voltage is raised to near the voltage VPGM by capacitive coupling with the word line WL or the like. The voltage difference between the control gate and the channel is reduced, and as a result, electrons are not injected into the charge storage layer 336, so that the threshold voltage of the memory cell transistor MT is maintained. To be precise, there may be small changes in the threshold voltage, but the threshold voltage does not change to the extent that the threshold voltage distribution state transitions to a higher state.

Figure 8:
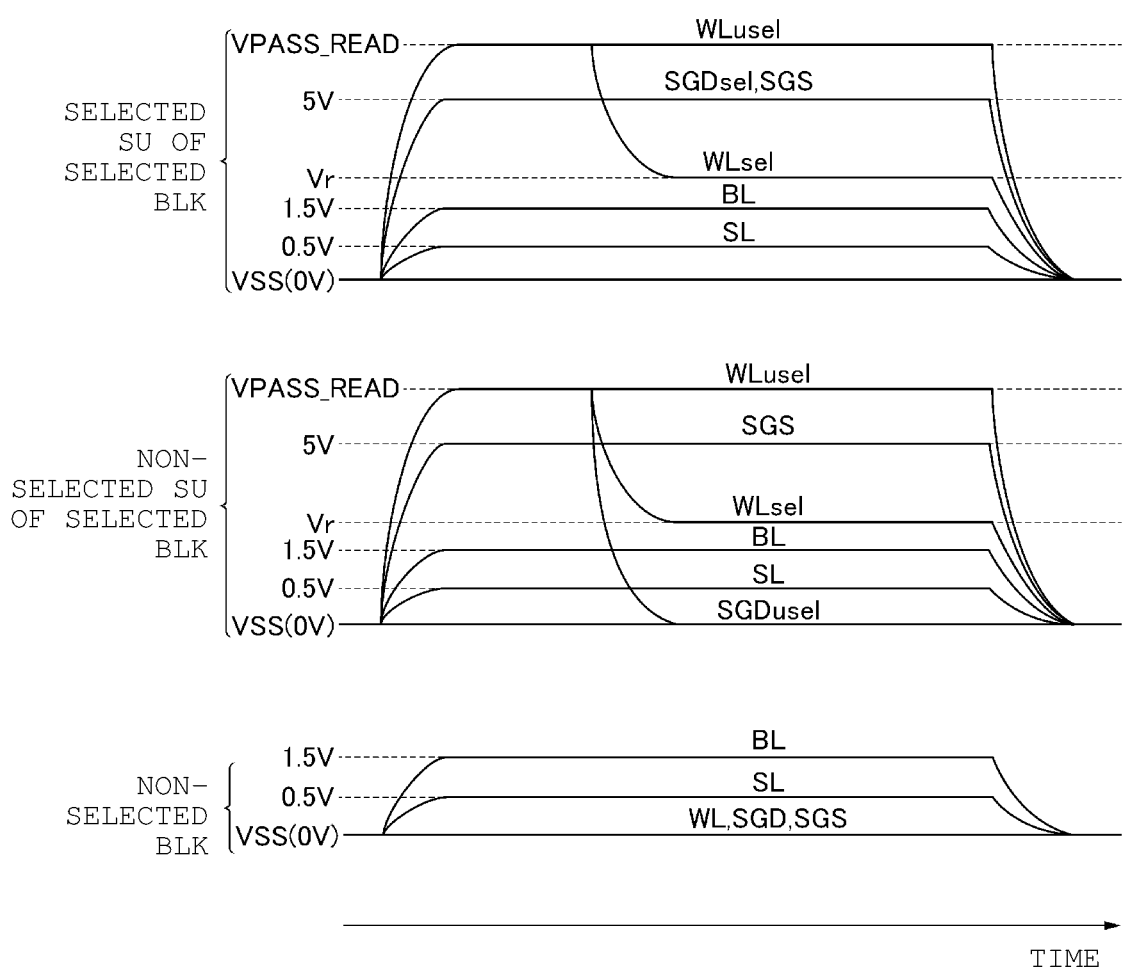
FIG. 8 is a diagram showing a voltage change of each wiring during a read operation.

The read operation will be described. The verification operation performed following the program operation is substantially the same as the read operation described below. FIG. 8 shows the voltage change of each wiring during the read operation. In the read operation, the NAND string NS including the read-target memory cell transistor MT is selected. In other words, the string unit SU including the read-target page is selected.

First, for example, 5 V is applied from the voltage generation circuit 43 to the selected select gate line SGDsel, the non-selected select gate line SGDusel, and the select gate line SGS via the row decoder 130. Thus, the select transistor ST1 and the select transistor ST2 in the selected block BLK are turned on. Further, for example, the read pass voltage VPASS_READ is applied from the voltage generation circuit 43 to the selected word line WLsel and the non-selected word lines via the row decoder 130. The read pass voltage VPASS_READ is a voltage that can turn on the memory cell transistor MT and does not change the threshold voltage, regardless of the threshold voltage of the memory cell transistor MT. Thus, regardless of whether it is the selected string unit SU or the non-selected string unit SU, the bit line BL and the source line layer 320 are electrically connected to each other, in all the NAND strings NS in the selected block BLK.

Next, a read voltage Vr such as VrA is applied from the voltage generation circuit 43 via the row decoder 130 to the word line WL connected to the memory cell transistor MT that is the target of the read operation (selected word line WLsel). The read pass voltage VPASS_READ is applied to the other word lines (non-selected word lines WLusel).

Further, while maintaining the voltage applied to the selected select gate line SGDsel and the select gate line SGS, for example, a voltage Vss is applied to the non-selected select gate line SGDusel from the voltage generation circuit 43 via the row decoder 130. Thus, the select transistor ST1 in the selected string unit SU remains on, but the select transistor ST1 in the non-selected string unit SU is turned off. Further, regardless of whether it is the selected string unit SU or the non-selected string unit SU, the select transistor ST2 in the selected block BLK is turned on.

Thus, the NAND string NS in the non-selected string unit SU does not form a current path between the bit line BL and the source line layer 320 because at least the select transistor ST1 is turned off. On the other hand, in the NAND string NS in the selected string unit SU, a current path between the bit line BL and the source line layer 320 is formed or is not formed according to the relationship between the read voltage Vr applied to the selected word line WLsel and the threshold voltage of the memory cell transistor MT.

The sense amplifier 120 applies a voltage of, for example, 1.5 V to the bit line BL. Further, the voltage of the source line SL at this time is, for example, 0.5 V.

In this state, the sense amplifier 120 reads out data based on the value of the current flowing through the bit line BL. Specifically, it is determined whether the threshold voltage of the memory cell transistor MT that is the target of the read operation is higher than the read voltage applied to the memory cell transistor MT. The data may be read out not based on the value of the current flowing through the bit line BL, but based on the temporal change of the voltage in the bit line BL. In the latter case, the bit line BL is pre-charged so as to have a predetermined voltage in advance.

The verification operation described above is also performed in the same manner as the read operation as described above. In the verification operation, a verification voltage such as VfyA is applied from the voltage generation circuit 43 to the word line WL connected to the memory cell transistor MT to be verified, via the row decoder 130.

The operation of applying a voltage of 5 V to the selected select gate line SGDsel and the non-selected select gate line SGDusel in the initial stage of the program operation described above may be omitted. Similarly, the operation of applying a voltage of 5 V to the non-selected select gate line SGDusel and applying the read pass voltage VPASS_READ to the selected word line WLsel in the initial stage of the read operation (or verification operation) described above may be omitted.

The erase operation will be described. In the erase operation, the data of all the memory cell transistors MT in the target block BLK is erased at once.

During the erase operation, the voltages of the bit line BL and the source line SL are both set to VERA. "VERA" is a voltage required for erasing the data of the memory cell transistor MT, for example, 20 V.

The voltages of the select gate lines SGD and SGS are lower than the above-described VERA, and are set to, for example, 13 V. In each of the select transistors ST1 and ST2, GIDL is generated based on the voltage difference between the voltage of each gate line and VERA, and the channel of each NAND string NS is charged via the generated hole. As a result, the voltage of the channel of the NAND string NS rises to VERA.

At this time, the voltage of each word line WL is set to a voltage (for example, the ground voltage) sufficiently lower than the above-described VERA. Each memory cell transistor MT transitions into the "Er" state when its threshold voltage drops due to the voltage difference between the word line WL and the channel.

Meanwhile, it is necessary to maintain the voltage of the source line SL, that is, the voltage of the source line layer 320, at a predetermined target voltage as described above, during both the program operation and the read operation. For example, in the read operation shown in FIG. 8, when the voltage of the source line layer 320 becomes higher than the target voltage (0.5 V in this example), the threshold voltage of the memory cell transistor MT cannot be appropriately determined, and it becomes impossible to read the data accurately.

However, local voltage fluctuations may occur in the source line layer 320 as current flows into the source line layer 320 from a large number of memory pillars MPs. In particular, as in the present embodiment, when the source line layer 320 is formed of polysilicon having a relatively high resistance, local voltage fluctuations in the source line layer 320 are likely to occur.

Therefore, the semiconductor storage device 2 according to the present embodiment includes a circuit for adjusting the voltage of the source line layer 320. Prior to explaining the circuit, a specific configuration of the memory cell array 110 will be described first.

Figure 9:
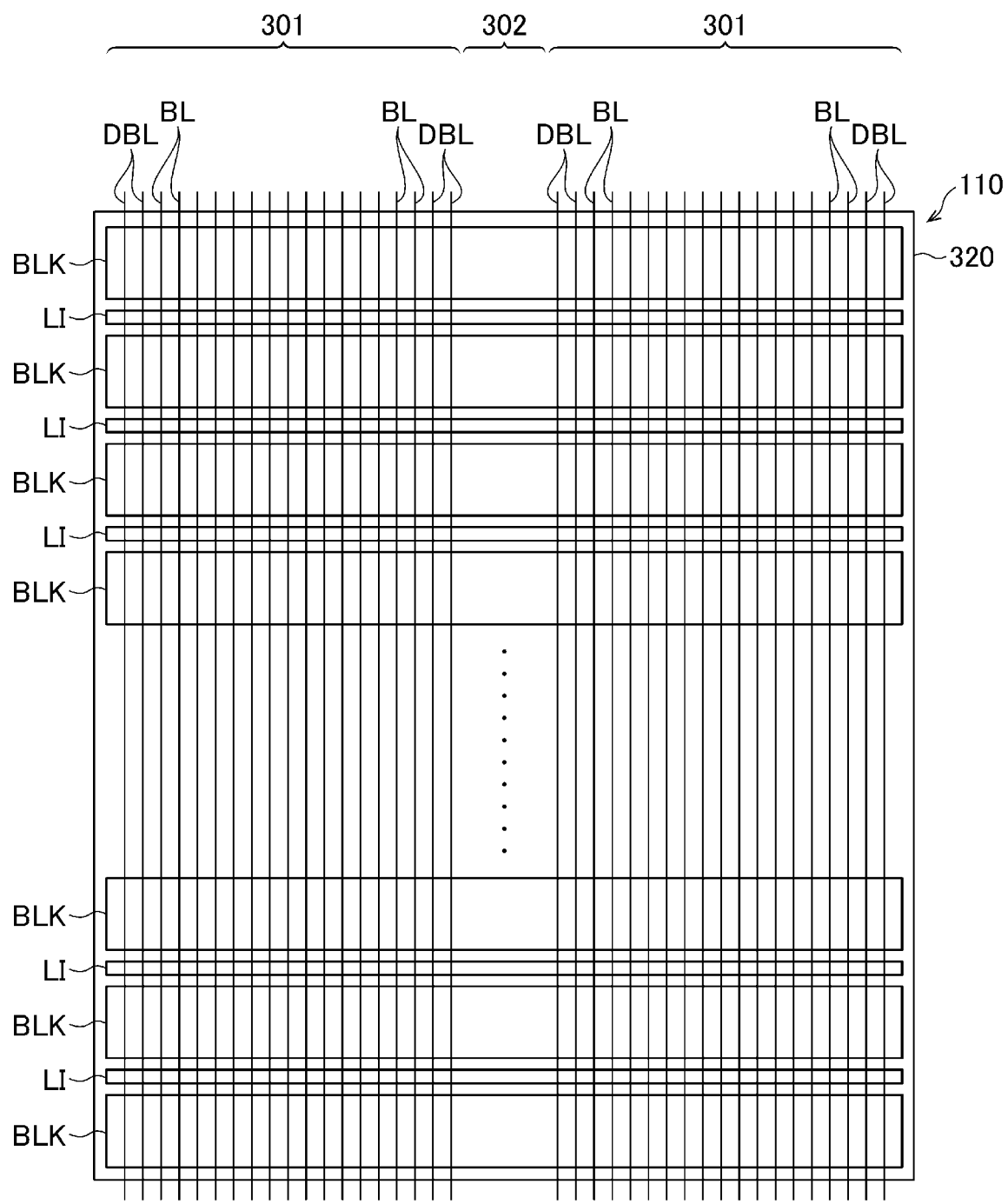
FIG. 9 is a diagram showing an arrangement of a plurality of blocks.

FIG. 9 schematically shows the arrangement of a plurality of blocks BLK provided in the memory cell array 110 in a plan view. As shown in FIG. 9, the plurality of blocks BLKs line up along the direction in which the bit lines BL extend (vertical direction in FIG. 9). As described above, the conductor LI is disposed between the blocks BLK adjacent to each other.

As shown in FIG. 9, one source line layer 320 is provided in the entire memory cell array 110, and is formed in a range that can include all the block BLKs in a plan view. That is, in the present embodiment, a single source line layer 320 is shared by all blocks BLK.

Each bit line BL extends so as to intersect with each block BLK, and one end thereof is connected to the sense amplifier 120 of FIG. 2. The bit lines BL line up at equal intervals along the left-right direction of FIG. 9. It is noted that the bit line BL is not provided in the central portion in the left-right direction, specifically, in the region with the reference numeral "302". The region is also referred to as a "connection region 302" below.

In the connection region 302 of each block BLK, neither the bit line BL nor the memory pillar MP is provided. Within the block BLK, a region other than the connection region 302, that is, a region in which the memory pillar MP is provided is referred to as a "cell region 301" below. The connection region 302 is a region that connects two cell regions 301 on both the left and right sides.

Figure 10:
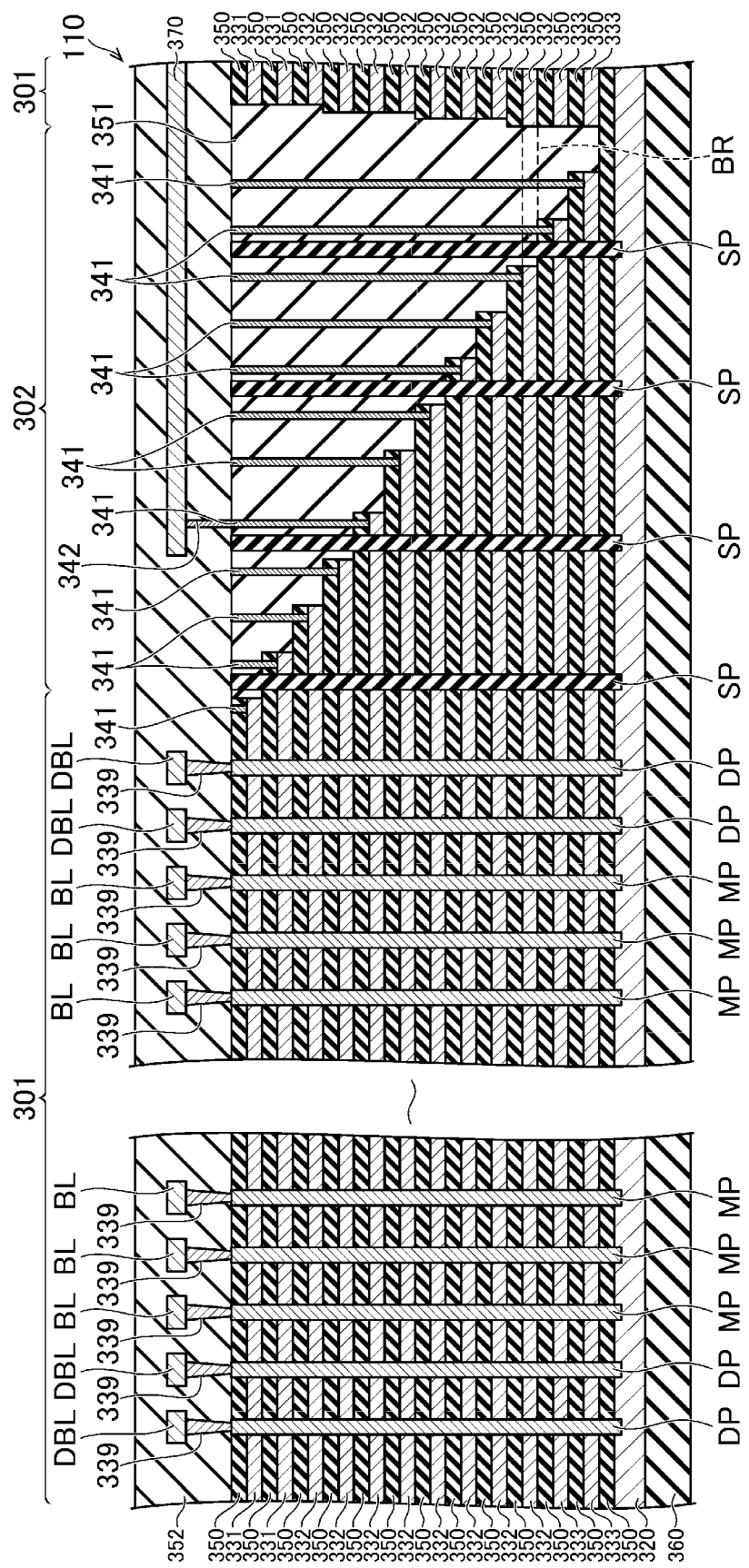
FIG. 10 is a cross-sectional view showing a configuration of a connection region and its vicinity.

FIG. 10 shows a cross-sectional view of the connection region 302 and its vicinity. The cross section shown in FIG. 10 is a cross section when the memory cell array 110 is cut perpendicular to the direction in which the bit line BL extends.

In the cell region 301, the wiring layers 333, 332, and 331 are stacked at intervals from each other, and an insulating layer 350 is formed between each of the wiring layers 333, 332, and 331. Further, an insulating layer 352 is formed around the bit line BL and the contact plug 339 disposed above the cell region 301. It is noted that the portion with the reference numeral "360" in the lower side of FIG. 10 is an insulating layer formed between the source line layer 320 and the semiconductor substrate 300, that is, an insulating layer covering the periphery of the peripheral circuit PER.

The memory pillars MPs are distributed in a grid pattern in a plan view as shown in FIG. 9, and as a result, a plurality of the memory pillar MPs are lined up along the left-right direction of FIGS. 9 and 10. A dummy pillar DP is located at a position further outside from the memory pillar MP located at the end most portion, among the memory pillars MPs lined up like this. In the cross section of FIG. 10, two dummy pillars DPs are disposed at positions in the cell region 301 near the end on the connection region 302 side.

The dummy pillar DP is a columnar body having the same configuration as the memory pillar MP, and is formed at the same time in the process of forming the memory pillar MP. Similar to the memory pillars MP, the dummy pillar DP penetrates the wiring layers 333, 332, and 331 in the vertical direction, and the lower end thereof is connected to the source line layer 320. Therefore, each portion of the dummy pillar DP that intersects each wiring layer functions as a transistor. However, the dummy pillar DP is not used for storing data.

As described above, among the plurality of columnar bodies formed in the cell region 301, the columnar bodies formed at the ends are not used as the memory pillar MP for storing data, but are dummy pillar DPs. That is, among the plurality of columnar bodies located in a grid pattern, only the columnar bodies in the inner region are used as the memory pillar MP. By excluding the use of the columnar bodies at the end (i.e., the dummy pillars DPs) that are more likely to have a shape that deviates from the uniform shape, as the memory pillar MP, it is possible to write and read data with high accuracy.

A dummy bit line DBL is provided above the dummy pillar DP. The dummy bit line DBL is a conductor extending in parallel with the bit line BL, and is connected to the end of the dummy pillar DP on the opposite side of the source line layer 320 via the contact plug 340. The shape of the dummy bit line DBL (for example, the width dimension, or the like) may be the same as or different from the shape of the bit line BL.

As shown in FIGS. 9 and 10, in the cell region 301, not only at the position near the end on the connection region 302 side but also at the position near the end on the opposite side to the connection region 302, the dummy pillars DPs are provided and dummy bit lines DBLs connected to the dummy pillars DPs are also provided.

In the connection region 302, the respective wiring layers 333, 332, and 331 are drawn out to right stepwise from the cell region 301. That is, the lower the layer, the longer each of the wiring layers 333, 332, and 331 extends into the connection region 302.

In the connection region 302, a part of each of the wiring layers 333, 332, and 331 is exposed upward, and the lower end of the contact 341 extending from above is connected to each exposed part. The contact 341 is a columnar member made of a conductive material such as tungsten. The upper end of the contact 341 is connected to the wiring 370 via the contact 342. The wiring 370 is a wiring for applying a voltage to the wiring layers 333, 332, and 331. The contact 342 and the wiring 370 are individually provided corresponding to the respective contacts 341. However, in FIG. 10, only one set thereof is shown but it should be understood that there are other sets. In the connection region 302, the insulating layer 351 is formed above the wiring layers 333, 332, and 331, that is, around the contact 341 and the support pillar SP described below.

A plurality of support pillars SP are formed in the connection region 302. The support pillar SP is provided for the purpose of reinforcing each of the insulating layers 350 formed stepwise, in the manufacturing process of the semiconductor storage device 10. The support pillar SP is formed of, for example, silicon oxide.

The wiring layers 333, 332, and 331 formed stepwise are directly connected to the wiring layers 333, 332, and 331 in the cell region 301 on the left side in FIG. 10, respectively. Further, the wiring layers 333, 332, and 331 formed stepwise and the wiring layers 333, 332, and 331 in the cell region 301 on the right side in FIG. 10 are electrically connected via a bridge portion BR which extends in the left-right direction on the back side or the front side of the paper surface, respectively. In FIG. 10, one of the bridge portions BR lined up in the vertical direction is shown by a dotted line.

With such a configuration, it is possible to individually apply a voltage to each of the wiring layers 333, 332, and 331 in the cell region 301 via the contact 341. The connection region 302 is provided in the central portion of the block BLK, and a voltage is applied from the connection region 302 to the wiring layers 333, 332, and 331 in the cell regions 301 on both the left and right sides, which makes the voltage of the wiring layer 331 or the like reach the target voltage in a short time.

Figure 11:
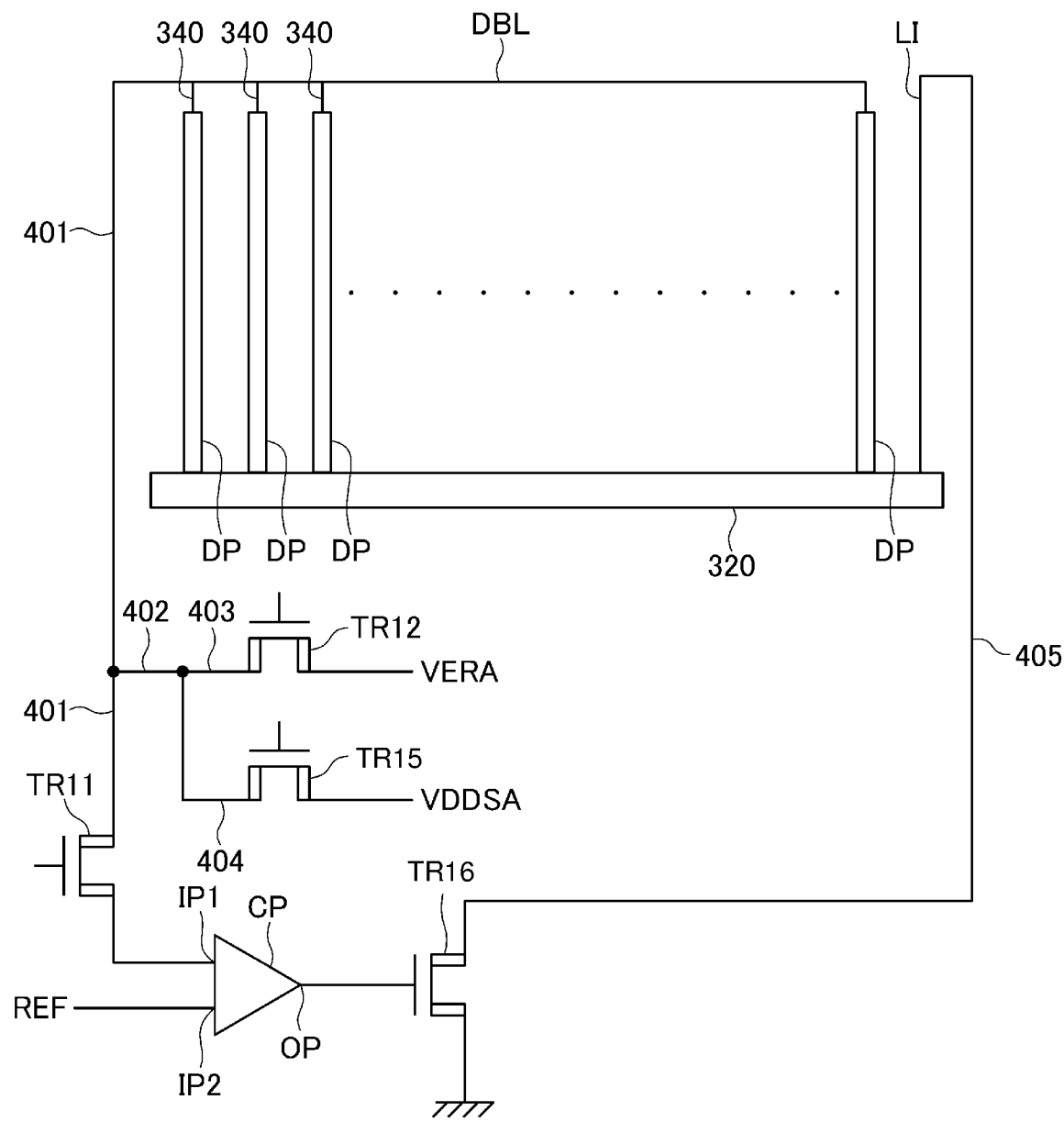
FIG. 11 is a diagram illustrating voltage adjustment of a source line layer.

A circuit for adjusting the voltage of the source line layer 320 will be described with reference to FIG. 11. In FIG. 11, the source line layer 320 and a plurality of dummy pillars DPs provided on the source line layer 320 are schematically drawn. The plurality of dummy pillars DPs shown in FIG. 11 are dummy pillar DPs provided in individual blocks BLK and connected to the same dummy bit line DBL. Further, in each block BLK of the memory cell array 110, at least one dummy pillar DP connected to the dummy bit line DBL shown in FIG. 11 is present.

The dummy bit line DBL to which the plurality of dummy pillars DPs are connected is connected to one end of a transistor TR11 via a wiring 401. The transistor TR11 is a circuit element provided on the semiconductor substrate 300 as a part of the peripheral circuit PER together with a comparator CP and transistors TR12, TR15, and TR16 described later. The wiring 401 includes, for example, a contact extending perpendicular to the upper surface of the semiconductor substrate 300.

The other end of the transistor TR11 is connected to the input terminal IP1 of the comparator CP. A reference voltage REF is input to another input terminal IP2 of the comparator CP. The output terminal of the comparator CP is connected to the gate of the transistor TR16.

The transistor TR16 has one end that is connected to the source line layer 320 via a wiring 405 and the conductor LI, and the other end that is grounded. The wiring 405 includes, for example, a contact extending perpendicular to the upper surface of the semiconductor substrate 300. The conductor LI to which the wiring 405 is connected may be a part or all of the plurality of conductors LI in the memory cell array 110.

The comparator CP adjusts the drivability of the transistor TR16 according to the magnitude relationship of the voltages respectively input to the input terminals IP1 and IP2. Specifically, when the voltage input to the input terminal IP1 becomes large, the drivability of the transistor TR16 increases, and the current flowing to the ground side via the transistor TR16 increases.

A wiring 402 is connected to the portion of the wiring 401 that is between the dummy bit line DBL and the transistor TR11. The wiring 402 is branched into two parts, that is, a wiring 403 and a wiring 404. The voltage VERA is input to the wiring 403 via the transistor TR12. The voltage VDDSA is input to the wiring 404 via the transistor TR15. The ON/OFF operations of the transistors TR11, TR12, and TR15 are controlled by the sequencer 41.

The circuit drawn under the source line layer 320 in FIG. 11 can be configured, for example, as a part of the voltage generation circuit 43 shown in FIG. 2.

The circuit operation when the read operation is performed will be described. When the read operation is performed, the sequencer 41 places the transistor TR11 in an ON state (closed state) and the transistors TR12 and TR15 in an OFF state (open state), respectively.

As described above with reference to FIG. 8, in the read operation, a voltage of, for example, 5 V is applied to the selected select gate line SGDsel and the select gate line SGS. Further, a read voltage Vr is applied to the selected word line WLsel, and a read pass voltage VPASS_READ is applied to the other non-selected word lines WLusel.

Such voltage to each wiring is also applied to the dummy pillar DP in the same selected block BLK. In the dummy pillar DP, all the transistors lined up along the longitudinal direction thereof are placed in the ON state (even the one connected to the selected word line WLsel because all dummy transistors are maintained in the ER state as further described below), and the dummy bit line DBL and the source line layer 320 are electrically connected via the dummy pillar DP. In the dummy pillars DP in the other non-selected blocks BLK, each transistor is in the OFF state, so that in the non-selected block BLK, the dummy bit line DBL and the source line layer 320 are not electrically connected.

At this time, the voltage of the portion of the source line layer 320, to which the lower end of the dummy pillar DP in the selected block BLK is connected, is input to the input terminal IP1 of the comparator CP. The voltage of the source line layer 320 is adjusted by adjusting the drivability of the transistor TR16 by the signal output from the output terminal OP of the comparator CP. As a result, finally, the voltage input to the input terminal IP1 matches the reference voltage REF. That is, the voltage of the portion of the source line layer 320, to which the lower end of the dummy pillar DP in the selected block BLK is connected, is in a state of matching the reference voltage REF. Therefore, when the reference voltage REF is set in advance to the target voltage of the source line SL (0.5 V in the example of FIG. 8) during the read operation, the voltage directly under at least the selected block BLK in the source line layer 320 can be automatically adjusted to reach the target voltage.

In the circuits shown in FIG. 11, the dummy pillar DP, the contact plug 340, the dummy bit line DBL, the wiring 401, the transistor TR11, and the wiring from the transistor TR11 to the input terminal IP1 function as a circuit for acquiring the voltage of the source line layer 320, and make up the "acquisition circuit" in the present embodiment.

Further, in the circuit shown in FIG. 11, the comparator CP, the transistor TR16, the wiring 405, and the conductor LI function as a circuit for adjusting the voltage of the source line layer 320 to a predetermined target voltage (that is, the reference voltage REF), and make up the "first adjustment circuit" in the present embodiment. A voltage may be supplied to the source line layer 320, for example, through the transistor TR15. Alternatively, a dedicated source line driver circuit configured to supply a voltage to the source line layer 320 may be provided.

The voltage of the source line layer 320 is acquired by the acquisition circuit during the read operation as described above. Further, the voltage of the source line layer 320 is also adjusted by the first adjustment circuit during the read operation.

Meanwhile, in a plurality of transistors in the dummy pillar DP, when the threshold voltage of some transistors rises and becomes higher than the read voltage Vr, the transistor remains in the OFF state and an electrical connection through the dummy pillar DP is cut off. Therefore, the acquisition circuit cannot acquire the voltage of the source line layer 320 as described above.

Therefore, when the program operation is performed, it is necessary to prevent the threshold voltage from rising in each transistor of the dummy pillar DP and maintain each threshold voltage at the "ER" state. Therefore, the sequencer 41 of the present embodiment places the transistors TR11 and TR12 in the OFF state and places the transistor TR15 in the ON state, during the program operation. Thus, the voltage of the dummy bit line DBL connected to each block BLK becomes the voltage VDDSA. The voltage VDDSA is, for example, 2.5 V, which is the voltage applied to BL(1) in the example of FIG. 7. In the state where the voltage of the dummy bit line DBL is the voltage VDDSA, the transistor corresponding to the select transistor ST1 in the dummy pillar DP is in the cutoff state, so that the threshold voltage of each transistor in the dummy pillar DP does not rise. The voltage VDDSA can be said to be "the voltage at which data is not written to the transistor of the dummy pillar DP".

In this way, during the program operation, the voltage of the dummy bit line DBL is adjusted to the voltage VDDSA, so that the threshold voltage of each transistor in the dummy pillar DP does not rise, and remains at the original "ER" state.

In the circuit shown in FIG. 11, the transistor TR15, the wiring 404, the wiring 402, the wiring 401, the dummy bit line DBL, and the contact plug 340 function as a circuit for adjusting the voltage of the dummy bit line DBL, and make up "the second adjustment circuit" in the present embodiment.

The sequencer 41 of the present embodiment places the transistors TR11 and TR15 in the OFF state, and places the transistor TR12 in the ON state, during the erase operation. Thus, the voltage of the dummy bit line DBL connected to each block BLK becomes the voltage VERA. As described above, "VERA" is a voltage required for erasing the data of the memory cell transistor MT, for example, 20 V. Since the voltage of the dummy bit line DBL becomes the voltage VERA during the erase operation, the threshold voltage of each transistor drops to the state "ER" in the dummy pillar DP connected to the dummy bit line DBL, as in the case of other memory pillars MPs in the same block. By performing the above operation during the erase operation, the threshold voltage of each transistor of the memory pillar MP can be more reliably maintained at the "ER" state. The voltage VERA can be said to be "the voltage at which data is erased from the transistor of the dummy pillar DP".

In the circuit shown in FIG. 11, the transistor TR12, the wiring 403, the wiring 402, the wiring 401, the dummy bit line DBL, and the contact plug 340 function as a circuit for adjusting the voltage of the dummy bit line DBL, and make up another "second adjustment circuit" in the present embodiment.

A relatively high voltage such as 20 V is applied to the transistor TR11, which is a part of the acquisition circuit, during the erase operation or the like. Therefore, a high-breakdown-voltage transistor is used as the transistor TR11. Similarly, high-breakdown-voltage transistors are used for the transistors TR12, TR15, and TR16. The high-breakdown-voltage transistor is configured so as not to cause dielectric breakdown even when a relatively high voltage is applied, and is larger than a normal transistor.

Figure 12:
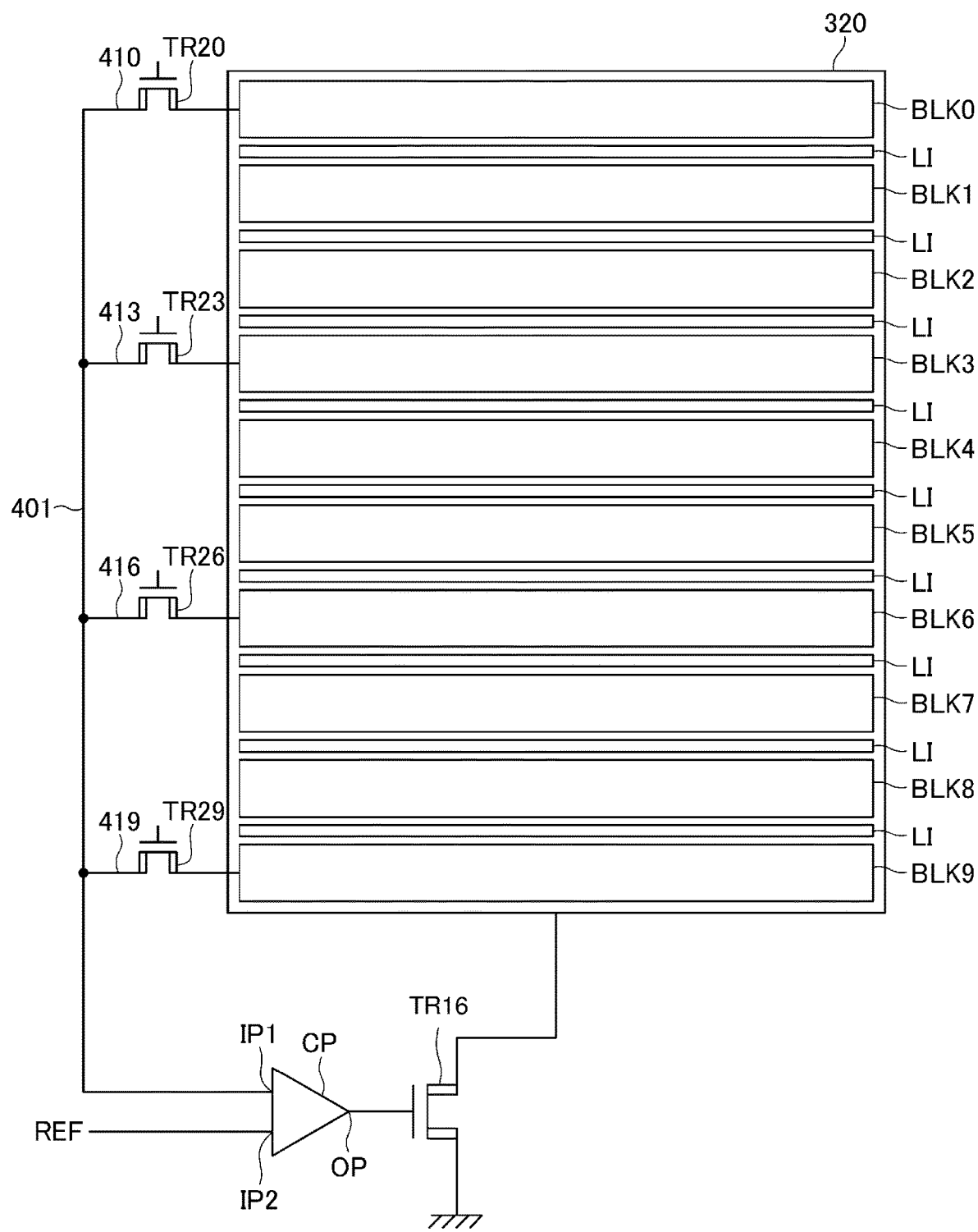
FIG. 12 is a diagram illustrating voltage adjustment of a source line layer of a semiconductor storage device according to a comparative example.

In order to explain the advantages of the configuration of the present embodiment, a comparative example shown in FIG. 12 will be described. Even in this comparative example, a comparator CP and a transistor TR16 are provided as circuit elements for adjusting the voltage of the source line layer 320. It is noted that in this comparative example, the dummy pillar DP and the dummy bit line DBL are not provided.

The wiring extending from the transistor TR16 is connected to the source line layer 320.

The wiring 401 is connected to the input terminal IP1 of the comparator CP. The wiring 401 is a wiring for acquiring a voltage in the vicinity of the selected block BLK in the source line layer 320 during the read operation. Wirings 410, 413, 416, and 419 are connected to the wiring 401, respectively. The wiring 410 is a wiring connected to a portion of the source line layer 320 directly under the block BLK0. The wiring 413 is a wiring connected to a portion of the source line layer 320 directly under the block BLK3. The wiring 416 is a wiring connected to a portion of the source line layer 320 directly under the block BLK6. The wiring 419 is a wiring connected to a portion of the source line layer 320 directly under the block BLK9.

A transistor TR20 is disposed in the wiring 410. A transistor TR23 is disposed in the wiring 413. A transistor TR26 is disposed in the wiring 416. A transistor TR29 is disposed in the wiring 419. The ON/OFF operation of each of these transistors is controlled by the sequencer 41. High-breakdown-voltage transistors are used as the transistors TR20, TR23, TR26, and TR29.

For example, when the block BLK0 is the selected block BLK in the read operation, the transistor TR20 connected directly under the block BLK0 is placed in the ON state, while the transistors TR23, TR26, and TR29 are placed in the OFF state. Thus, the voltage in the vicinity of the block BLK0, which is the selected block, in the source line layer 320 is adjusted to be the reference voltage REF. Similarly, for example, when the block BLK6 is the selected block BLK in the read operation, the transistor TR26 connected directly under the block BLK6 is placed in the ON state, while the transistors TR20, TR23, and TR29 are placed in the OFF state. Thus, the voltage in the vicinity of the block BLK6, which is the selected block, in the source line layer 320 is adjusted to be the reference voltage REF.

On the other hand, when the block BLK1 is the selected block BLK in the read operation, the transistor TR20 connected near the block BLK1 is placed in the ON state, while the transistors TR23, TR26, and TR29 are placed in the OFF state. In this case, the voltage in the vicinity of the block BLK0 in the source line layer 320 is adjusted to be the reference voltage REF.

Here, the block BLK1 which is a selected block is located at a position away from the block BLK0. During the read operation, a current from each memory pillar MP flows to the source line layer 320, and the electrical resistance of the source line layer 320 is relatively high. Therefore, a difference is likely to occur between the voltage of the source line layer 320 directly under the block BLK1 and the voltage of the source line layer 320 directly under the block BLK0. As a result, in the selected block (BLK1) in the read operation, the voltage of the source line layer 320 directly under the block (BLK1) becomes a voltage different from the target voltage (reference voltage REF), and the data may not be read accurately.

In order to solve such a problem, a wiring similar to the wiring 410 or the like is connected directly under all the blocks BLKs of the memory cell array 110, and a transistor similar to the transistor TR20 or the like is disposed in the wiring. However, such a configuration is not preferable because the size of the semiconductor storage device 2 is increased. In particular, in the configuration in which the peripheral circuit PER is provided below the source line layer 320, many existing wirings for connecting the upper wiring on which the bit line BL or the like is located and the peripheral circuit PER on the lower side are routed, and it is often difficult to provide additional wirings. Further, as the transistor TR20 or the like, a high-breakdown-voltage transistor larger than a normal transistor is used so as not to cause dielectric breakdown even when a relatively high voltage is applied. Therefore, as in the comparative example of FIG. 12, in the related art, it is necessary to reduce the number of portions of the source line layer 320 that can be the target of voltage adjustment, and the voltage adjustment of the source line layer 320 may not be appropriately performed.

On the other hand, in the semiconductor storage device 2 according to the present embodiment, as described above, the voltage directly under the selected block BLK in the source line layer 320 is acquired via the dummy pillar DP, and the voltage is automatically adjusted to reach the target voltage. In the present embodiment, it is not necessary to provide the transistor TR20 or the like shown in FIG. 12 or to control the ON/OFF state of the transistor TR20 or the like according to the selected block BLK, so that the configuration of the semiconductor storage device 2 can be simplified.

The dummy pillar DP, which is a part of the acquisition circuit, may be located at a position near the stepped connection region 302 as in the present embodiment, but may be located at another position. For example, when a region for electrically connecting the wiring on the upper side and the peripheral circuit PER on the lower side (that is, a region in which contacts vertically extending are disposed) is formed in a part of the cell region 301, the dummy pillar DP may be located at a position near that region.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
    a plurality of word line layers stacked at intervals above one another in a first direction;
    a memory pillar having a columnar body penetrating the plurality of the word line layers, wherein each portion of the memory pillar intersecting the word line layers functions as a memory cell transistor;
    a source line layer to which an end of the memory pillar is connected;
    an acquisition circuit configured to acquire a voltage of the source line layer; and
    a first adjustment circuit configured to adjust the voltage of the source line layer to a predetermined target voltage based on the acquired voltage, wherein
    the acquisition circuit includes a dummy pillar having a columnar body penetrating the plurality of word line layers and having an end connected to the source line layer, wherein each portion of the dummy pillar intersecting the word line layers functions as a dummy transistor.

2. The semiconductor storage device according to claim 1, further comprising:
a bit line extending in a second direction intersecting the first direction, and connected to another end of the memory pillar opposite to the source line layer, wherein
the acquisition circuit includes a dummy bit line extending in the second direction parallel to the bit line and connected to another end of the dummy pillar opposite to the source line layer.

3. The semiconductor storage device according to claim 2, wherein
the acquisition circuit is configured to acquire the voltage of the source line layer, when a read operation of reading data from the memory cell transistor is performed.

4. The semiconductor storage device according to claim 3, further comprising:
a second adjustment circuit configured to adjust a voltage of the dummy bit line, wherein
the second adjustment circuit is configured to adjust the voltage of the dummy bit line to be equal to a voltage of the bit line, when the erase operation is performed on the memory cell transistor.

5. The semiconductor storage device according to claim 3, further comprising:
a second adjustment circuit configured to adjust a voltage of the dummy bit line, wherein
the second adjustment circuit is configured to adjust the voltage of the dummy bit line to be equal to a voltage of the bit line, when a program operation is performed and a threshold voltage of the memory cell transistor has reached a target state.

6. The semiconductor storage device according to claim 1, wherein
a circuit for controlling an operation of the memory cell transistor is provided at a position on a side of the source line layer that is opposite to the memory pillar.

7. The semiconductor storage device according to claim 1, wherein
a plurality of the memory pillars are arranged in a grid pattern above the source line layer, and
the dummy pillar is provided at a position that is outside the grid pattern.

8. The semiconductor storage device according to claim 7, wherein
the acquisition circuit includes another dummy pillar having a columnar body penetrating the plurality of word line layers and having an end connected to the source line layer, and
the memory pillars arranged in the grid pattern are between the dummy pillars.

9. The semiconductor storage device according to claim 1, wherein the acquisition circuit includes a high-breakdown-voltage transistor.

10. A semiconductor storage device comprising:
a memory cell array including a source line layer and a plurality of blocks of memory cells located above the source line layer, wherein the plurality of blocks of memory cells are arranged along a first direction parallel to the source line layer and separated by a plate-shaped conductor that is in contact with the source line layer and extends above the source line layer and in a second direction crossing the first direction;
a plurality of bit lines extending in the first direction above each of the blocks and arranged along the second direction, the plurality of bit lines including first bit lines and second bit lines;
a plurality of dummy bit lines extending in the first direction above each of the blocks and arranged along the second direction between the first bit lines and the second bit lines;
a plurality of dummy pillars extending above the source line layer, wherein first ends of the dummy pillars are in contact with the source line layer and second ends of the dummy pillars are respectively connected to the dummy bit lines through a conductive contact; and
a voltage adjustment circuit configured to adjust a voltage of the source line layer according to the voltage of the source line acquired through the dummy pillars.

11. The semiconductor storage device according to claim 10, further comprising:
additional dummy bit lines extending in the first direction above end portions of each of the blocks in the second direction; and
additional dummy pillars extending above the source line layer, wherein first ends of the additional dummy pillars are in contact with the source line layer and second ends of the additional dummy pillars are respectively connected to the additional dummy bit lines through a conductive contact, wherein
the voltage adjustment circuit is configured to adjust the voltage of the source line layer according to the voltage of the source line acquired through the dummy pillars and the additional dummy pillars.

12. The semiconductor storage device according to claim 10, wherein
the voltage adjustment circuit includes a comparator having a first input connected to the dummy bit lines, a second input supplied with a reference voltage, and an output connected to a gate of a transistor having a first end connected to the plate-shaped conductor and a second end connected to ground, and
when the voltage at the first input of the comparator is higher than a voltage at the second input of the comparator, the comparator outputs a signal to the transistor that turns on the transistor to decrease the voltage of the source line layer.

13. The semiconductor storage device according to claim 12, wherein
the voltage adjustment circuit further includes a first transistor between the dummy bit lines and the first input of the comparator, a second transistor between the dummy bit lines and a first voltage supply line, and a third transistor between the dummy bit lines and a second voltage supply line, and
during a read operation, the first transistor is turned on and the second and third transistors are turned off.

14. The semiconductor storage device according to claim 13, wherein
the first voltage supply line is at a higher voltage than the second voltage supply line, and
during an erase operation, the second transistor is turned on and the first and third transistors are turned off.

15. The semiconductor storage device according to claim 13, wherein
the first voltage supply line is at a higher voltage than the second voltage supply line, and during a write operation, the third transistor is turned on and the first and second transistors are turned off.

\* \* \* \* \*